(12) United States Patent
Futase et al.

(10) Patent No.: US 7,566,662 B2
(45) Date of Patent: Jul. 28, 2009

(54) METHOD OF DRY CLEANING SILICON SURFACE PRIOR TO FORMING SELF-ALIGNED NICKEL SILICIDE LAYER

(75) Inventors: Takuya Futase, Tokyo (JP); Hideaki Tsugane, Tokyo (JP); Mitsuo Kimoto, Tokyo (JP); Hidenori Suzuki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 286 days.

(21) Appl. No.: 11/733,316

(22) Filed: Apr. 10, 2007

(65) Prior Publication Data

US 2007/0238321 A1    Oct. 11, 2007

(30) Foreign Application Priority Data

Apr. 10, 2006 (JP) .............................. 2006-107780

(51) Int. Cl.
*H01L 21/306* (2006.01)
(52) U.S. Cl. .................. 438/682; 438/731; 438/906; 257/E21.226; 134/1.2
(58) Field of Classification Search .................. 438/731
See application file for complete search history.

(56) References Cited

U.S. PATENT DOCUMENTS

| | | | |
|---|---|---|---|
| 6,864,183 B2 * | 3/2005 | Maekawa ................... | 438/710 |
| 2006/0051966 A1 * | 3/2006 | Or et al. ..................... | 438/706 |
| 2007/0015360 A1 * | 1/2007 | Lu et al. ..................... | 438/682 |
| 2007/0117382 A1 * | 5/2007 | Koo et al. ................... | 438/677 |
| 2007/0202695 A1 * | 8/2007 | Kawamura et al. .......... | 438/664 |

FOREIGN PATENT DOCUMENTS

JP    2002-093739    3/2002

\* cited by examiner

*Primary Examiner*—Stephen W Smoot
(74) *Attorney, Agent, or Firm*—Antonelli, Terry, Stout & Kraus, LLP.

(57) ABSTRACT

Provided is a method of manufacturing a semiconductor device. After a semiconductor wafer is placed over a wafer stage with which a dry cleaning chamber of a film forming apparatus is equipped, dry cleaning treatment is given over the surface of the semiconductor wafer with a reducing gas. Then, the semiconductor wafer is heat treated at a first temperature of from 100 to 150° C. by using a shower head kept at 180° C. The semiconductor wafer is then vacuum-transferred to a heat treatment chamber, wherein the semiconductor wafer is heat treated at a second temperature of from 150 to 400° C. A product remaining over the main surface of the semiconductor wafer is thus removed. The present invention makes it possible to manufacture a semiconductor device having improved reliability and production yield by reducing variations in the electrical properties of a nickel silicide layer.

22 Claims, 17 Drawing Sheets

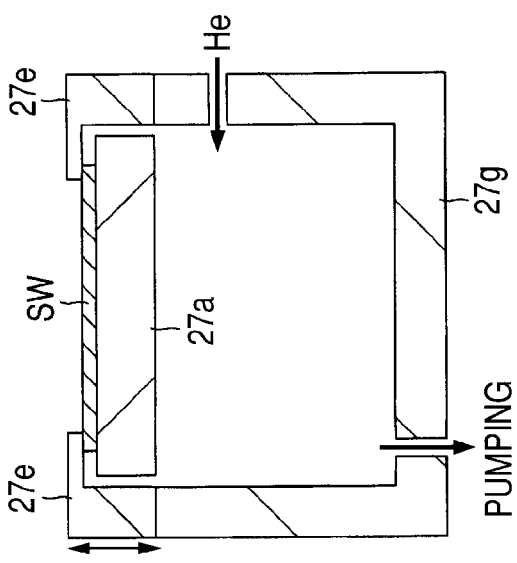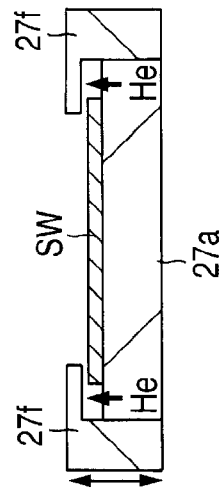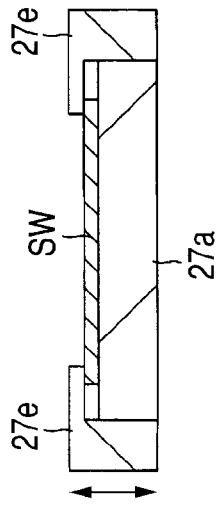

METHOD OF DRY CLEANING SILICON SURFACE PRIOR TO FORMING SELF-ALIGNED NICKEL SILICIDE LAYER

CROSS-REFERENCE TO RELATED APPLICATIONS

The disclosure of Japanese Patent Application No. 2006-107780 filed on Apr. 10, 2006 including the specification, drawings and abstract is incorporated herein by reference in its entirety.

BACKGROUND OF THE INVENTION

The present invention relates to a manufacturing technology of a semiconductor device, in particular, to a technique effective when applied to the manufacture of a semiconductor element having a nickel silicide layer.

With increasing integration density of semiconductor devices, field effect transistors (Metal Insulator Semiconductor Field Effect Transistors) are miniaturized according to the scaling rule. The miniaturization of field effect transistors however does not lead to a high-speed operation because of an increase in the resistance of a gate or source and drain. For example, in field effect transistors having a gate length of 0.2 µm or less, a salicide technology of forming a low-resistance silicide layer, for example, a nickel silicide layer or cobalt silicide layer in self alignment over the surface of a conductive film constituting a gate or over the surface of semiconductor regions constituting the source and drain, thereby reducing the resistance of the gate or source and drain is under investigation.

When a natural oxide film is present on the surface of a film or the like over which a silicide layer is formed (for example, a conductive film constituting a gate and semiconductor regions constituting source and drain), however, the resistance of the silicide layer becomes uneven. Prior to the formation of the silicide layer, therefore, the surface of the film or the like over which the silicide layer is formed is washed to remove therefrom the natural oxide film or impurities.

In Japanese Patent Laid-Open No. 2002-93739 (Paragraph [0008], Paragraph [0009], FIG. 1), described is a technology including, prior to the salicide step, a step of carrying out reactive plasma treatment with reactive plasma for causing a reduction reaction over the substrate in the cleaning step performed over the substrate.

SUMMARY OF THE INVENTION

A nickel silicide (NiSi) layer has a resistance as low as from 14 to 20 µΩ·cm and can be prepared, for example, by salicide technology at a relative low temperature from 400 to 600° C. This enables formation of a low-resistance and shallow junction so that a nickel silicide layer has recently been adopted for the source and drain of field effect transistors which must be miniaturized.

The nickel silicide layer formed by the salicide technology however has various technical problems which will be described below.

Before deposition of a nickel film over the surface of a semiconductor substrate, dry cleaning with a reducing gas such as combination of HF gas and $NH_3$ gas or combination of $NF_3$ gas and $NH_3$ gas or dry cleaning with a reactive plasma generated by the excitation of an Ar gas added with a reducing gas such as $NF_3$ gas and $NH_3$ gas or $NF_3$ gas and $H_2$ gas is performed to remove a natural oxide film or impurities from the surface of the semiconductor substrate. After the dry cleaning treatment, ammonium fluorosilicate $((NH_4)_2SiF_6)$ is formed on the surface of the semiconductor substrate. Remaining of such a product on the surface of the semiconductor substrate may cause variations in the resistance of the nickel silicide layer formed by the salicide technology.

As a result of studying the removal of the above-described product by warming the dry-cleaned surface of the semiconductor substrate at about 100° C. which is a sublimation temperature of the product, it has however been elucidated that even warming of the semiconductor substrate at about 100° C. cannot sublimate the product completely and therefore variations in the resistance of the silicide layer cannot be avoided. This is presumed to occur because the product thus formed on the surface of the semiconductor substrate is not composed only of a composition of $(NH_4)_2SiF_6$ but also contains a composition slightly different therefrom (a compound having a non-stoichiometric composition and indicated also by $(NH_4)_2SiF_6$ for convenience sake if it does not cause any confusion) and a product having a slightly different composition remains on the surface of the semiconductor substrate without subliming at about 100° C.

An object of one invention according to the present application is to provide a technology capable of manufacturing a semiconductor device having improved reliability and production yield by reducing variations in the electrical properties of a nickel silicide layer.

The above and other objects of the one invention according to the present application, object of the other invention, and novel features of them will be apparent by the description herein and accompanying drawings.

Outline of the typical inventions, of the inventions disclosed by the present application, will next be described briefly.

In one aspect of the present invention, there is thus provided a method of manufacturing a semiconductor device, which comprises the steps of: placing a semiconductor wafer over a wafer stage of a first chamber prior to deposition of a nickel film over silicon; dry cleaning the surface of the silicon over the main surface of the semiconductor wafer with a reducing gas supplied via a shower head located above the wafer stage; heat treating the semiconductor wafer at a first temperature of from 100 to 150° C. while utilizing the heating temperature of the shower head; transferring the semiconductor wafer from the first chamber to a second chamber; and heat treating the semiconductor wafer in the second chamber at a second temperature of from 150 to 400° C.

In another aspect of the present invention, there is also provided a method of manufacturing a semiconductor device, which comprises the steps of: placing a semiconductor wafer over a wafer stage of a first chamber prior to deposition of a nickel film over silicon; dry cleaning the surface of the silicon over the main surface of the semiconductor wafer with a reducing gas supplied via a shower head located above the wafer stage; and heat treating the semiconductor wafer at a first temperature of from 180 to 220° C. while utilizing the heating temperature of the shower head.

In a further aspect of the present invention, there is also provided a method of manufacturing a semiconductor device, which comprises the steps of: placing a semiconductor wafer over a wafer stage of a first chamber prior to deposition of a nickel film over silicon; dry cleaning the surface of the silicon over the main surface of the semiconductor wafer with a reducing gas supplied via a shower head located above the wafer stage without dry cleaning the side surface and back surface of the semiconductor wafer; transferring the semiconductor wafer from the first chamber to a second chamber; and heat treating the semiconductor wafer in the second chamber at a second temperature of from 150 to 400° C.

The outline of the other inventions included in the present application will next be shown in paragraphs.

1. A method of manufacturing a semiconductor device by forming a nickel silicide layer in self alignment, which comprises, prior to deposition of a nickel film over silicon, the steps of: (a) placing a semiconductor wafer over a wafer stage of a first chamber; (b) dry cleaning the surface of the silicon over the main surface of the semiconductor wafer with a reducing gas supplied via a shower head located above the wafer stage; (c) heat treating the semiconductor wafer at a first temperature while utilizing the heating temperature of the shower head; (d) transferring the semiconductor wafer from the first chamber to a second chamber; and (e) heat treating the semiconductor wafer in the second chamber at a second temperature greater than the first temperature.

In this application, a description is made mainly of a nickel silicide process. It is however needless to say that the process of each of sub-paragraphs 1, 8 and 11 can be applied as pre-treatment (dry cleaning) of another wafer treatment.

Described specifically, dry cleaning is performed as cleaning (for example, treatment for converting a natural oxide film over a silicon surface into a substance which sublimes, evaporates or volatilizes at a relatively low temperature (for example, 400° C. or less)) before wafer treatment such as heat treatment or film formation. During dry cleaning, cleaning residues (including product formed by the cleaning) attributable to dry cleaning appear, resulting in deposition, dropwise condensation or aggregation of them over the surface of the wafer (including upper surface, side surface and back surface). The resulting cleaning residues are heat treated at a first temperature (temperature of the upper surface of the wafer) in the chamber where dry cleaning has been performed while making use of a part or whole of a cleaning mechanism, whereby a portion of the cleaning residues is evaporated and removed. The wafer is then transferred to another treatment chamber, in which it is heat treated at a second temperature (temperature of the upper surface of the wafer) greater than the first temperature to evaporate the remaining residue.

The heat treatment at the first temperature is advantageous because it needs a relatively low temperature so that an apparatus having a relatively simple structure can be employed and an adequate through-put can be ensured. It is also advantageous because the residue can be relatively completely (to an extent sufficient to avoid spread of contamination which will otherwise occur by handling) removed from the back surface and side surface by this treatment and does not interfere with the handling of the wafer. The heat treatment at the second temperature is necessary when the product containing a non-stoichiometric composition, if any, sometimes increases the evaporation temperature and in addition, it sometimes increases the effective evaporation temperature on the practical upper surface of the wafer having a complex structure, depending on the geomorphologic feature.

2. In the method of manufacturing a semiconductor device as described above in Paragraph 1, the first temperature is from 100 to 150° C.

3. In the method of manufacturing a semiconductor device as described above in Paragraph 1, the second temperature is from 150 to 400° C.

4. In the method of manufacturing a semiconductor device as described above in Paragraph 1, the second temperature is from 165 to 350° C.

5. In the method of manufacturing a semiconductor device as described above in Paragraph 1, the second temperature is from 180 to 220° C.

6. In the method of manufacturing a semiconductor device as described above in Paragraph 1, the second temperature is 200° C.

7. In the method of manufacturing a semiconductor device as described above in any one of Paragraphs 1 to 6, the semiconductor wafer is vacuum-transferred from the first chamber to the second chamber.

8. A method of manufacturing a semiconductor device by forming a nickel silicide layer in self alignment, which comprises, prior to deposition of a nickel film over silicon, the steps of: (a) placing a semiconductor wafer over a wafer stage of a first chamber; (b) dry cleaning the surface of the silicon over the main surface of the semiconductor wafer with a reducing gas supplied via a shower head located above the wafer stage; and (c) heat treating the semiconductor wafer at a first temperature while utilizing the heating temperature of the shower head; wherein the shower head is maintained at a temperature greater than 180° C.

Described specifically, when dry cleaning is performed as cleaning (for example, treatment for converting a natural oxide film over the silicon surface into a substance which sublimes, evaporates or volatilizes at a relatively low temperature (for example, 400° C. or less)) before wafer treatment such as heat treatment or film formation, cleaning residues (including product formed by the cleaning) attributable to dry cleaning appear, resulting in deposition, dropwise condensation or aggregation of them over the surface of the wafer (including upper surface, side surface and back surface). The resulting cleaning residues are heat treated at a sufficiently high temperature (temperature of the upper surface of the wafer) in the chamber where dry cleaning has been performed, while making use of a part or whole of a cleaning mechanism, whereby almost all the cleaning residues are evaporated and removed.

This method is advantageous because the cleaning residues can be removed by the single heat treatment in one chamber and therefore the treatment chamber of the apparatus can be used effectively.

9. In the method of manufacturing a semiconductor device as described above in Paragraph 8, the first temperature is from 180 to 220° C.

10. In the method of manufacturing a semiconductor device as described above in Paragraph 8, the first temperature is 200° C.

11. A method of manufacturing a semiconductor device by forming a nickel silicide layer in self alignment, which comprises, prior to the deposition of a nickel film over silicon, the steps of: (a) placing a semiconductor wafer over a wafer stage of a first chamber; (b) dry cleaning the surface of the silicon over the main surface of the semiconductor wafer with a reducing gas supplied via a shower head located above the wafer stage; (c) transferring the semiconductor wafer from the first chamber to the second chamber; and (d) heat treating the semiconductor wafer at a second temperature in the second chamber, wherein no reducing gas is supplied to the side surface and back surface of the semiconductor wafer.

Described specifically, when dry cleaning is performed as cleaning (for example, treatment for converting a natural oxide film over the silicon surface into a substance which sublimes, evaporates or volatilizes at a relatively low temperature (for example, 400° C. or less)) before wafer treatment such as heat treatment or film formation, cleaning residues (including product formed by the cleaning) attributable to the dry cleaning appear, resulting in deposition, dropwise condensation or aggregation of them over the wafer surface (dry cleaning must be performed so as not to adhere the deposit onto the peripheral portion of the upper surface, side surface or back surface of the wafer). The resulting cleaning residues are heat treated at a sufficiently high temperature (temperature of the upper surface of the wafer) in a chamber different from the dry cleaning chamber to evaporate and remove almost all the cleaning residues.

The above-described method is advantageous because the cleaning residues can be removed by single heat treatment so that a sufficient through-put can be ensured.

12. In the method of manufacturing a semiconductor device as described above in Paragraph 11, the second temperature is from 150 to 400° C.

13. In the method of manufacturing a semiconductor device as described above in Paragraph 11, the second temperature is from 165 to 350° C.

14. In the method of manufacturing a semiconductor device as described above in Paragraph 11, the second temperature is from 180 to 220° C.

15. In the method of manufacturing a semiconductor device as described above in Paragraph 11, the second temperature is 200° C.

16. In the method of manufacturing a semiconductor device as described above in any one of Paragraphs 11 to 15, the step (b) includes the sub-step of: (b1) holding down, with a sealing, the peripheral portion of the semiconductor wafer placed over the wafer stage.

17. In the method of manufacturing a semiconductor device as described above in any one of Paragraphs 11 to 15, the step (b) includes the sub-steps of: (b1) adsorbing the semiconductor wafer onto the wafer stage by using an electrostatic chuck; and (b2) covering the peripheral portion of the semiconductor wafer with a shadow ring without bringing it into contact with the semiconductor wafer and supplying an inert gas from the peripheral portion of the wafer stage.

18. In the method of manufacturing a semiconductor device as described above in any one of Paragraphs 11 to 15, the step (b) includes the sub-steps of: (b1) holding down, with a sealing, the peripheral portion of the semiconductor wafer placed over the wafer stage; and (b2) supplying an inert gas from the back side of the wafer stage.

19. In a method of manufacturing a semiconductor device as described above in any one of Paragraphs 11 to 18, the semiconductor wafer is vacuum transferred between the first chamber and the second chamber.

20. In the method of manufacturing a semiconductor device as described above in any of Paragraphs 1, 8 and 11, the silicon is polycrystalline silicon constituting a gate electrode of a field effect transistor or single crystal silicon constituting the semiconductor wafer having source and drain diffusion regions formed therein.

Advantages available by typical inventions, of the inventions disclosed by the present application, will next be described briefly.

Since variations in the electrical properties of a nickel silicide layer can be reduced, a semiconductor element having improved reliability and production yield can be obtained.

BRIEF DESCRIPTION OF THE DRAWINGS

FIGS. 22(a), (b) and (c) are each a schematic cross-sectional view of a dry cleaning chamber, with which a film forming apparatus of a silicide material is equipped, according to Embodiment 3 of the present invention.

DETAILED DESCRIPTION OF THE INVENTION

Figure 1:
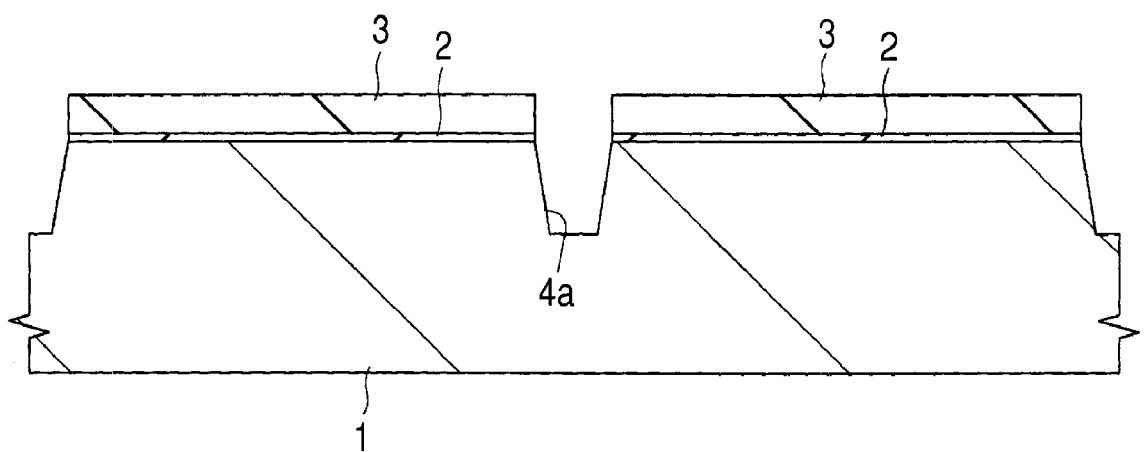
FIG. 1 is a fragmentary cross-sectional view of a semiconductor substrate illustrating a manufacturing step of a CMOS device according to Embodiment 1 of the present invention.

In the below-described embodiments, a description will be made after divided in plural sections or in plural embodiments if necessary for convenience sake. These plural sections or embodiments are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be greater than or less than the specific number unless otherwise specifically indicated or principally apparent that the number is limited to the specific number. Moreover in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or utterly different in principle. This also applies to the above-described value and range.

In the below-described embodiments, MIS•FET (Metal Insulator Semiconductor Field Effect Transistor) representative of field effect transistors is abbreviated as MIS, p channel MIS•FET is abbreviated as pMIS, and n channel MIS•FET is abbreviated as nMIS. Even if "MOS" is used for the convenience sake, non-oxide films are not excluded. In the below-described embodiments, the term "wafer" indicates mainly "Si (Silicon) single crystal wafer", but the term "wafer" indicates not only it but also SOI (Silicon On Insulator) wafer or an insulating film substrate for forming an integrated circuit thereover. The shape of the wafer is not limited to disc or substantially disc, but also square and rectangular wafer can be employed. It is needless to say that the term "silicon film", "silicon portion", "silicon member" or the like means not only a film, portion or member composed of pure silicon but also that containing impurities, an alloy having silicon as a main component such as SiGe or SiGeC (including strained silicon), and that containing additives unless otherwise clearly apparent that it is not or specifically indicated that it is not.

It is needless to say that the term "polycrystalline silicon" embraces not only a typical one but also amorphous silicon or the like unless otherwise clearly apparent that it is not or specifically indicated that it is not.

In all the drawings for describing the embodiments, like members of a function will be identified by like reference numerals and overlapping descriptions will be omitted. The present invention will hereinafter be described in detail based on accompanying drawings.

The dry cleaning technique is disclosed in Japanese Patent Application No. 2006-30704 (filed on Jan. 11, 2006) and Japanese Patent Application No. 2006-12355 (filed on Jan. 20, 2006) by Ichinose, et al., so that overlapping descriptions will not be repeated in principle.

EMBODIMENT 1

Figure 12:
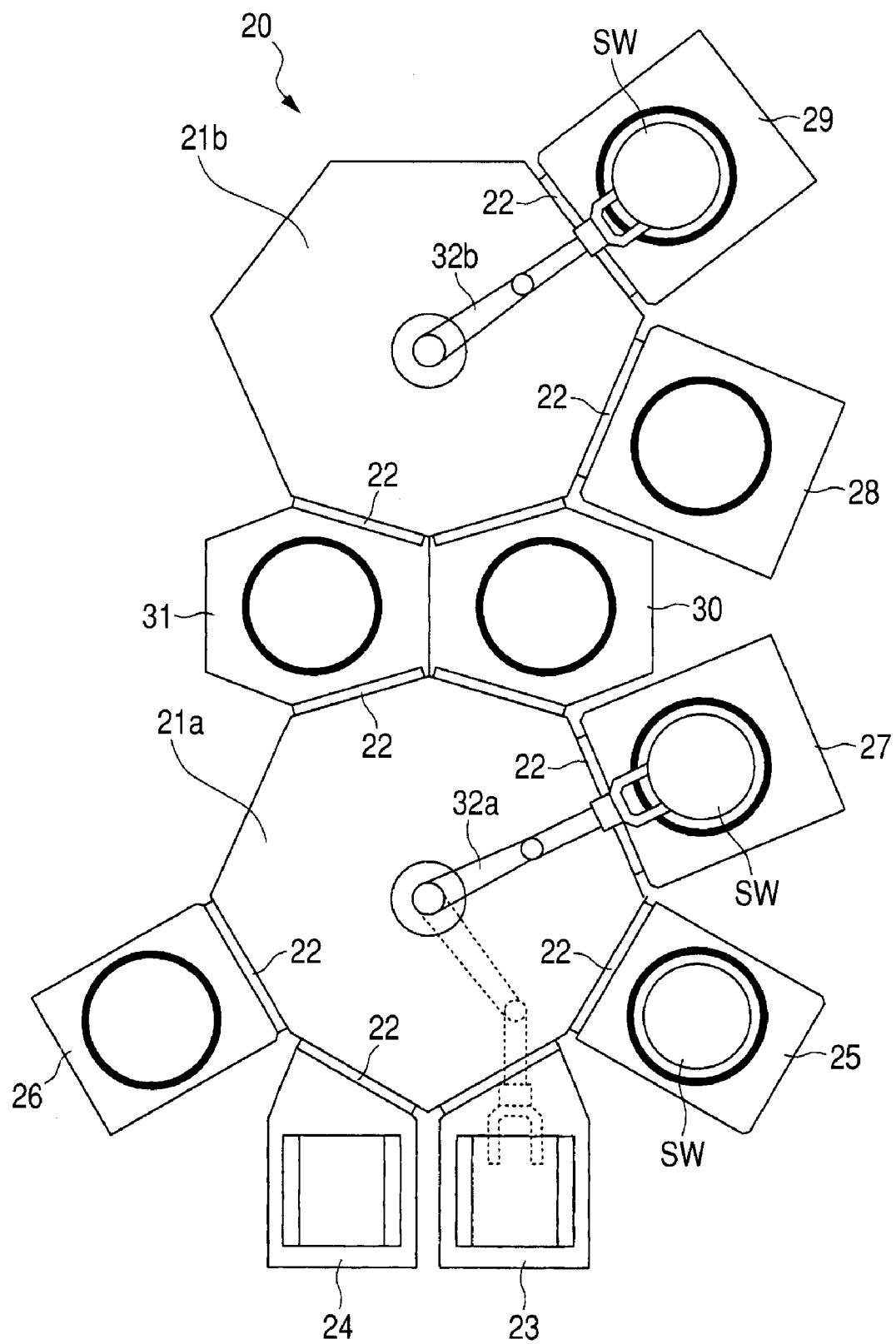
FIG. 12 is a schematic plan view of a film forming apparatus of a silicide material according to Embodiment 1 of the present invention.
Figure 13:
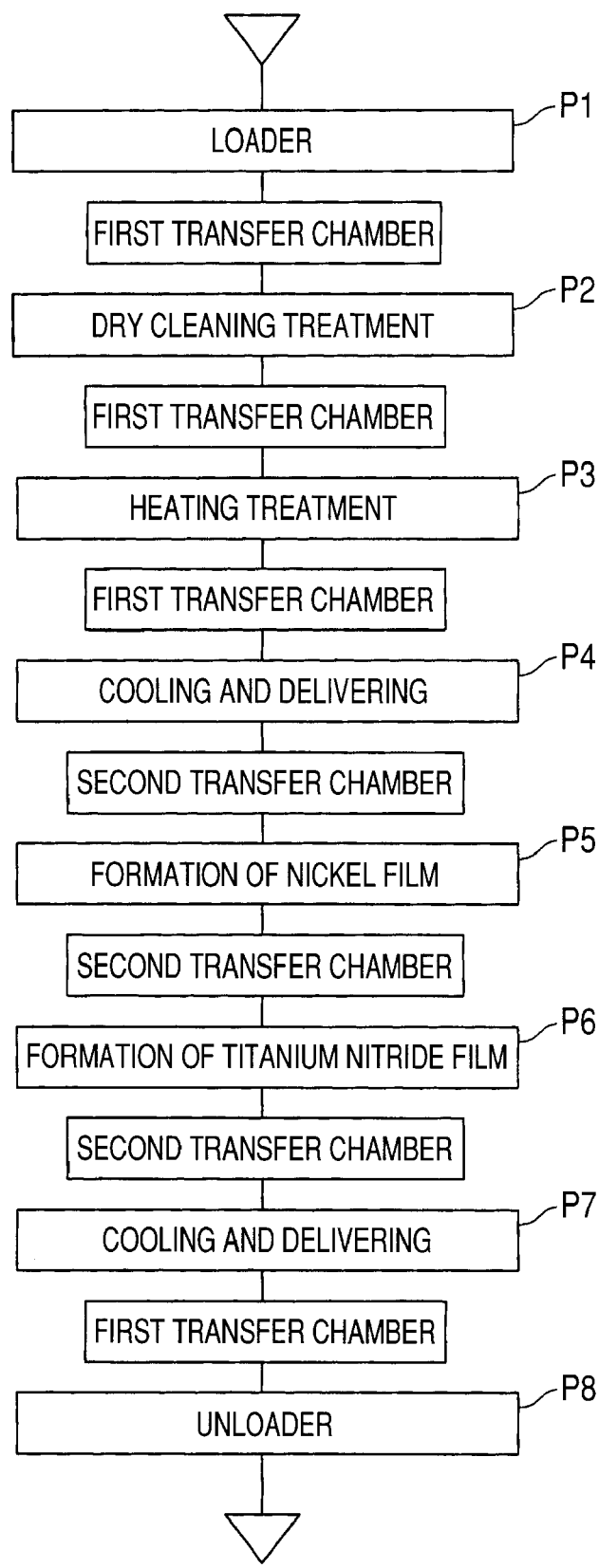
FIG. 13 is a film formation flow chart of the silicide material according to Embodiment 1 of the present invention.
Figure 14:
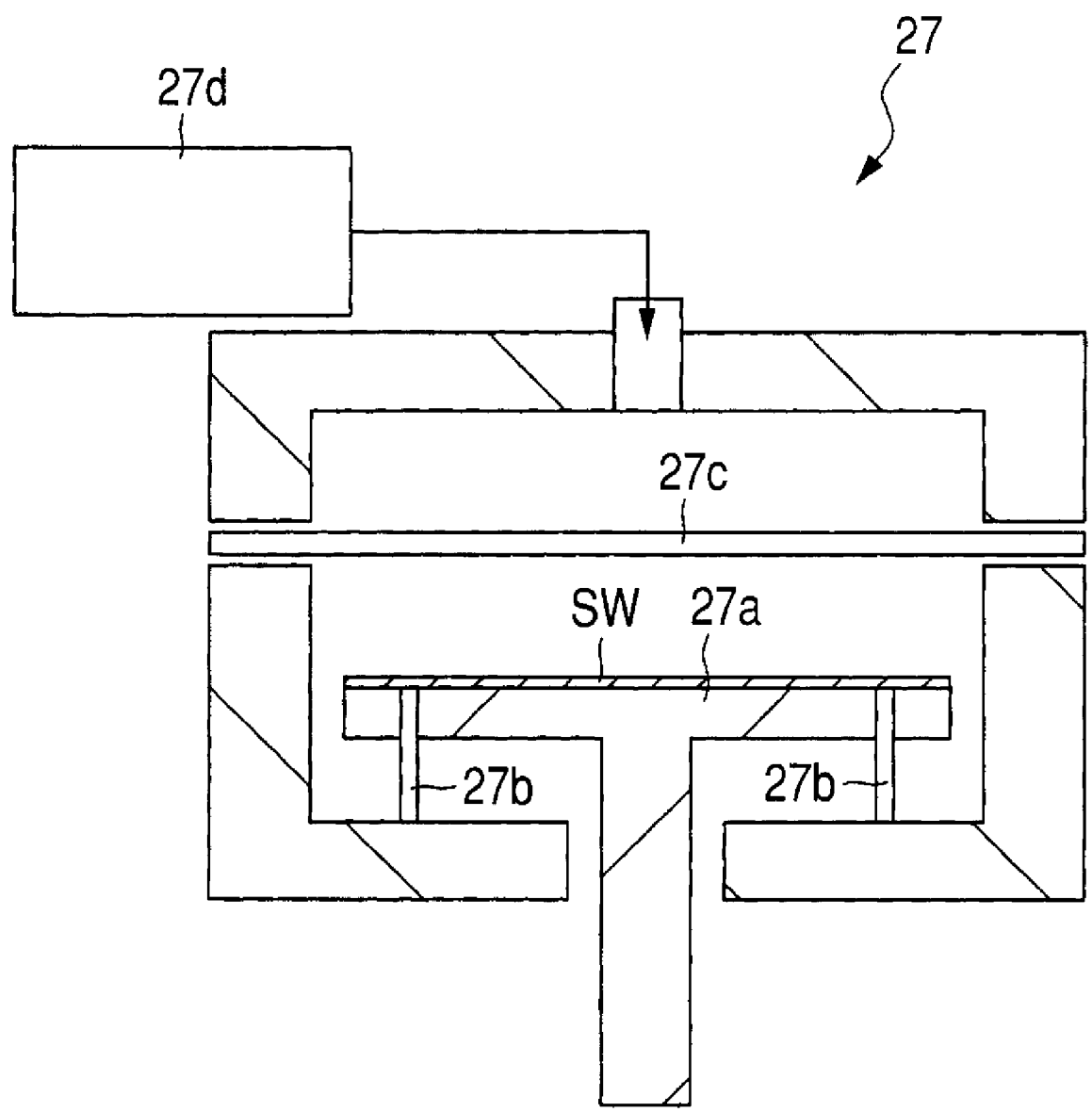
FIG. 14 is a schematic cross-sectional view illustrating a dry cleaning chamber, with which the film forming apparatus of the silicide material is equipped, according to Embodiment 1 of the present invention.
Figure 15A:
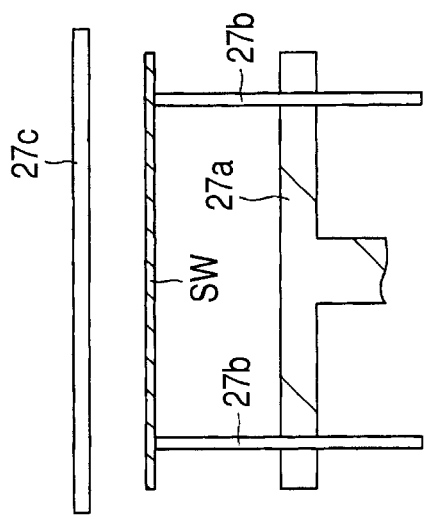
FIGS. 15(a), (b) and (c) are each a schematic cross-sectional view of the dry cleaning chamber, with which the film forming apparatus of the silicide material is equipped, according to Embodiment 1 of the present invention for explaining the treatment step of the semiconductor wafer in the chamber.
Figure 15B:
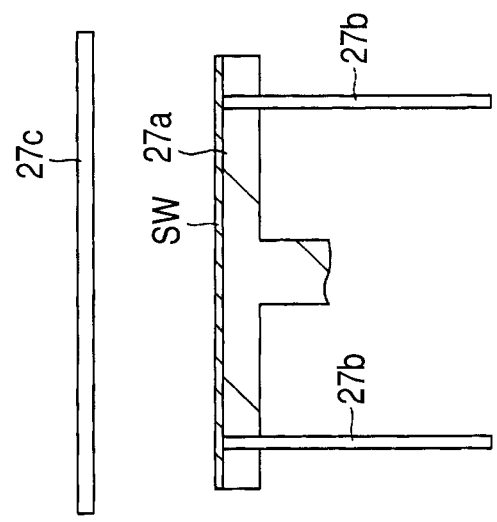
Figure 15C:
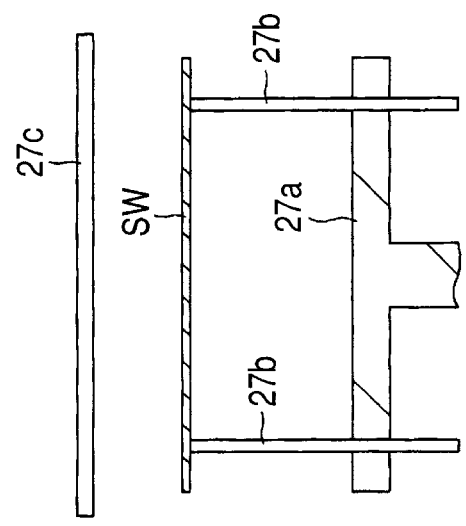
Figure 16:
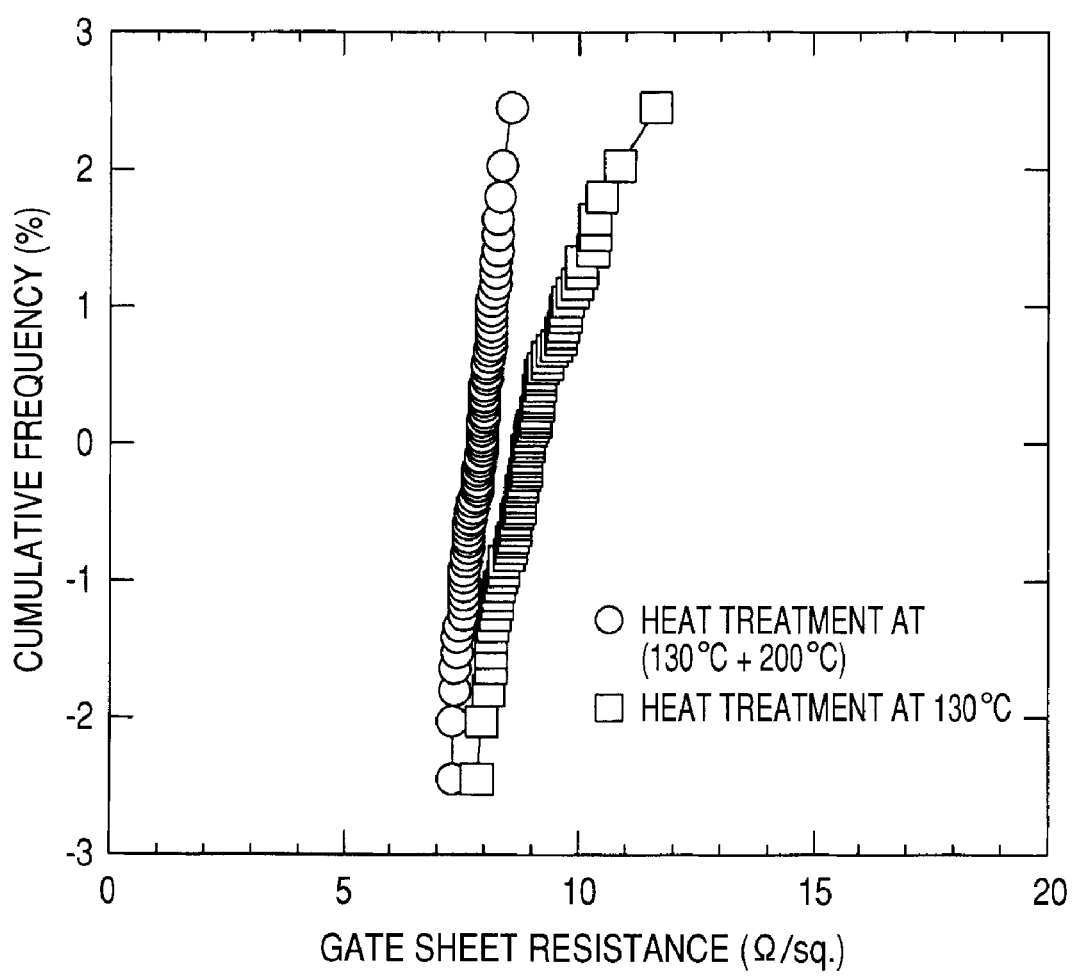
FIG. 16 is a graph showing variations in electrical resistance of a gate electrode having thereon a nickel silicide layer according to Embodiment 1 of the present invention.

A manufacturing method of a COMS (Complementary Metal Oxide Semiconductor) device according to Embodiment 1 of the present invention will be described based on FIGS. 1 to 19. FIGS. 1 to 11 and FIGS. 17 to 19 are fragmentary cross-sectional views of the CMOS device; FIG. 12 is a schematic plan view of a film forming apparatus of a silicide material; FIG. 13 is a film formation flow chart of the silicide material; FIG. 14 is a schematic cross-sectional view of a dry cleaning chamber with which the film forming apparatus of the silicide material is equipped; FIG. 15 is a schematic cross-sectional view of the dry cleaning chamber, with which the film forming apparatus of the silicide material is equipped, for explaining the treatment step of a semiconductor wafer in the chamber; and FIG. 16 is a graph showing the variations of electrical resistance of a gate electrode.

As illustrated in FIG. 1, a semiconductor substrate (thin semiconductor plate having a substantially flat disk shape, which is called "semiconductor wafer") 1 made of, for example, p type single crystal silicon is prepared. After formation of a silicon oxide film 2 of about 10 nm thick over the surface of the semiconductor substrate 1 by thermal oxidation of the substrate, a silicon nitride film 3 of, for example, about 100 nm thick is deposited by CVD (Chemical Vapor Deposition). With a resist pattern as a mask, the silicon nitride film 3, silicon oxide film 2 and semiconductor substrate 1 are dry etched successively to form a trench 4a of about 300 nm deep in the semiconductor substrate 1 of the element isolation region.

Figure 2:
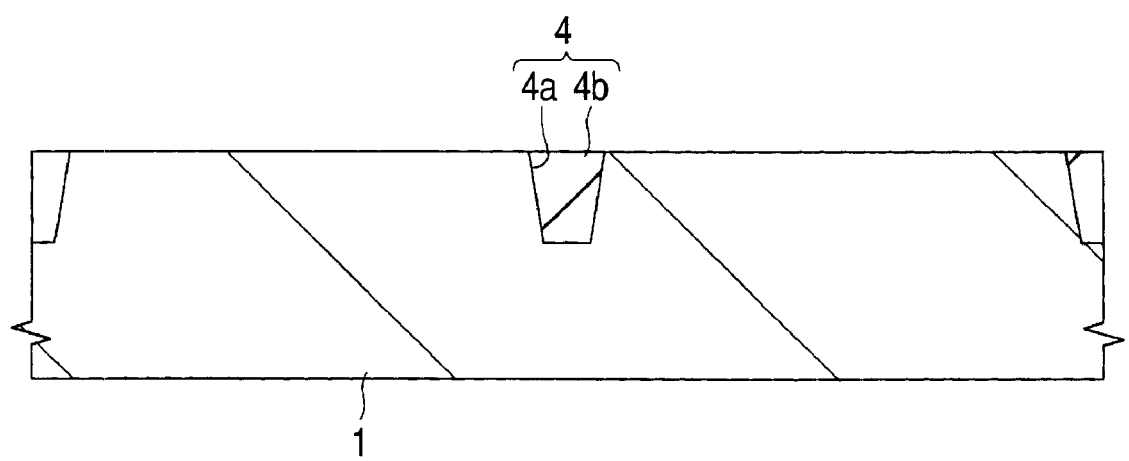
FIG. 2 is a fragmentary cross-sectional view of the same portion as that of the CMOS device illustrated in FIG. 1 in a manufacturing step following that of FIG. 1.

As illustrated in FIG. 2, after the silicon nitride film 3 is removed by wet etching with hot phosphoric acid, an insulating film 4b is deposited over the main surface of the semiconductor substrate 1 including the inside of the trench 4a by CVD. The insulating film 4b is then polished by CMP (Chemical Mechanical Polishing) to leave the insulating film 4b inside of the trench 4a, whereby an element isolation 4 is formed. The semiconductor substrate 1 is then heat treated at a temperature of about 1000° C. to anneal the insulating film 4b buried in the trench 4a.

Figure 3:
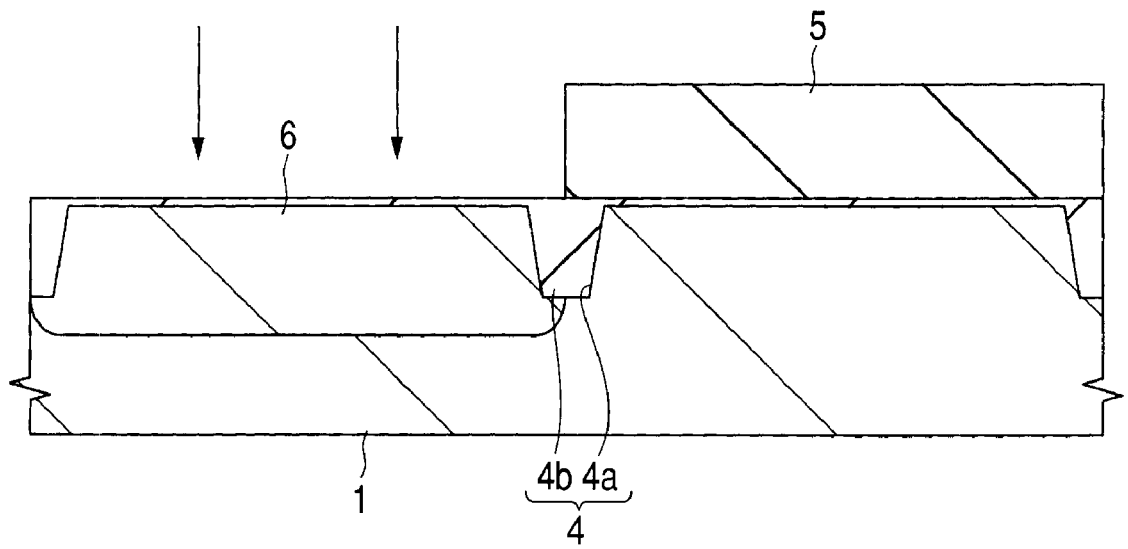
FIG. 3 is a fragmentary cross-sectional view of the same portion as that of the CMOS device illustrated in FIG. 1 in a manufacturing step following that of FIG. 2.
Figure 4:
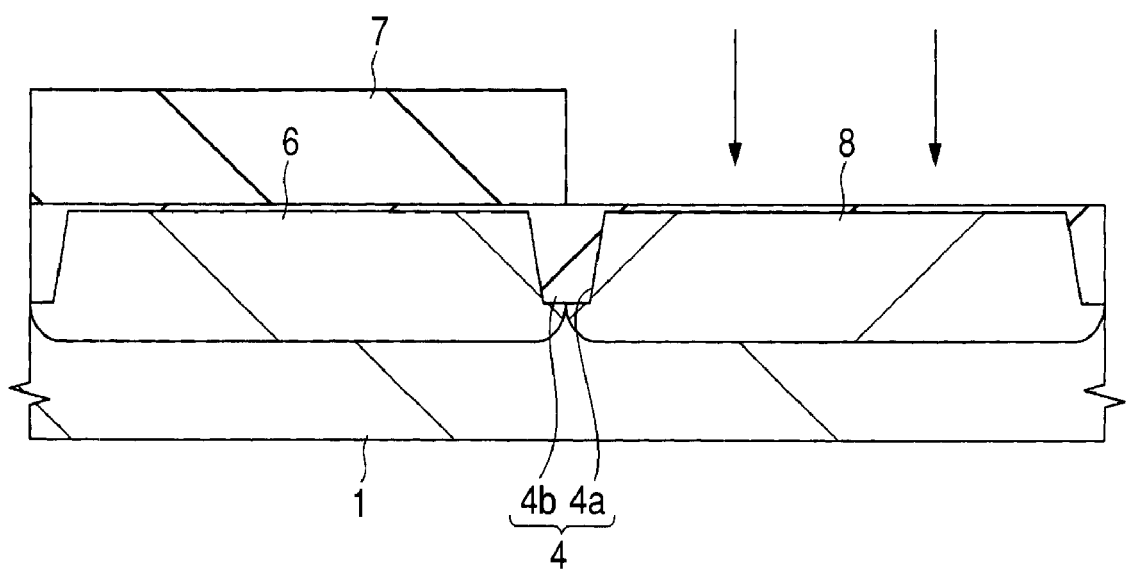
FIG. 4 is a fragmentary cross-sectional view of the same portion as that of the CMOS device illustrated in FIG. 1 in a manufacturing step following that of FIG. 3.

As illustrated in FIG. 3, a pMIS formation region is covered with a resist pattern 5 and a p type impurity such as boron (B) is ion-implanted into an nMIS formation region of the semiconductor substrate 1 to form a p well 6. Similarly, as illustrated in FIG. 4, the nMIS formation region is covered with a resist pattern 7 and an n type impurity such as phosphorus (P) or arsenic (As) is ion-implanted into the pMIS formation region of the semiconductor substrate 1 to form an n well 8.

Figure 5:
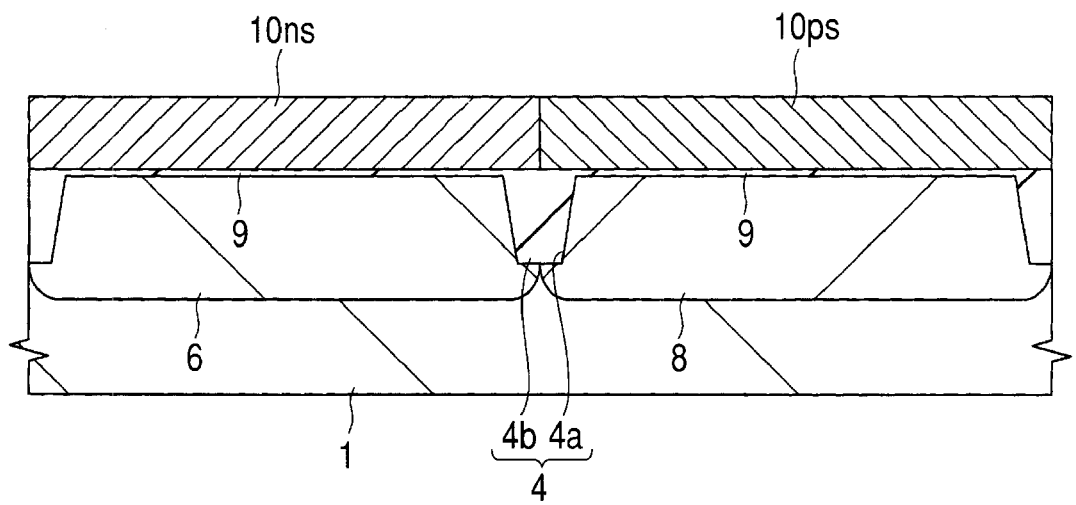
FIG. 5 is a fragmentary cross-sectional view of the same portion as that of the CMOS device illustrated in FIG. 1 in a manufacturing step following that of FIG. 4.

As illustrated in FIG. 5, after the surface of the semiconductor substrate 1 is cleaned by wet etching with, for example, an aqueous solution of hydrofluoric acid (HF), the semiconductor substrate 1 is thermally oxidized to form a gate insulating film 9 of about 5 nm thick over the surface of the semiconductor substrate 1 (surface of the p well 6 and n well 8). An amorphous silicon film of about 200 nm thick is deposited by CVD over the gate insulating film 9, followed by ion implantation of an n type impurity such as phosphorus into the amorphous silicon film in the nMIS formation region and a p type impurity such as boron into the amorphous silicon film in the pMIS formation region.

The semiconductor substrate 1 is then heat treated, for example, at 900° C. for 10 seconds to activate the n type impurity and p type impurity introduced into the amorphous silicon film and moreover, change the amorphous silicon film in the nMIS formation region into an n type polycrystalline silicon film 10*ns* and the amorphous silicon film in the pMIS formation region into a p type polycrystalline silicon film 10*ps*.

Figure 6:
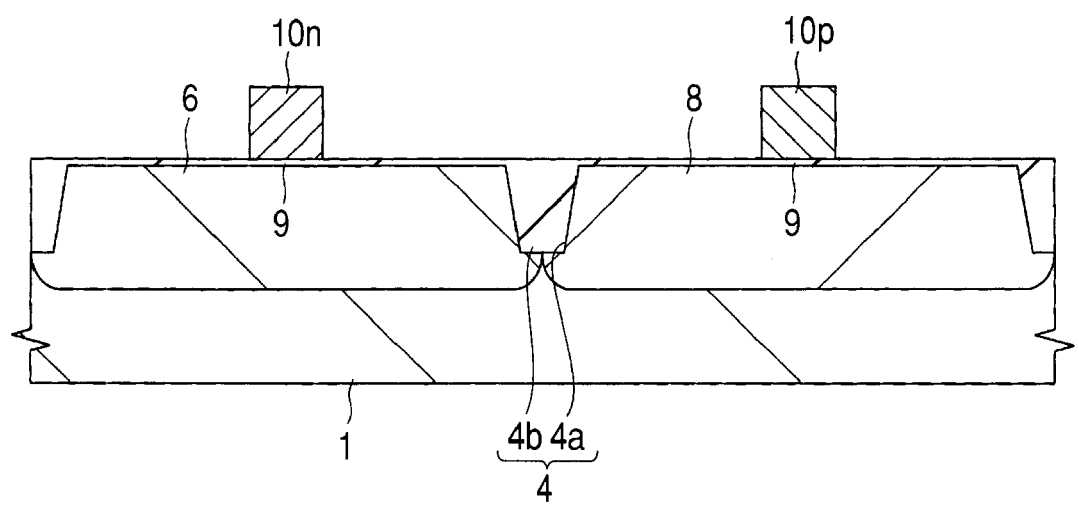
FIG. 6 is a fragmentary cross-sectional view of the same portion as that of the CMOS device illustrated in FIG. 1 in a manufacturing step following that of FIG. 5.

As illustrated in FIG. 6, by dry etching with a resist pattern as a mask, the n type polycrystalline silicon film 10*ns* is processed, whereby a gate electrode 10n composed of the n type polycrystalline silicon film 10ns and having a gate length of about 50 nm is formed in the nMIS formation region. At the same time, by dry etching with a resist pattern as a mask, the p type polycrystalline silicon film 10ps is processed and a gate electrode 10p composed of the p type polycrystalline silicon film 10ps and having a gate length of about 50 nm is formed in the pMIS formation region.

Figure 7:
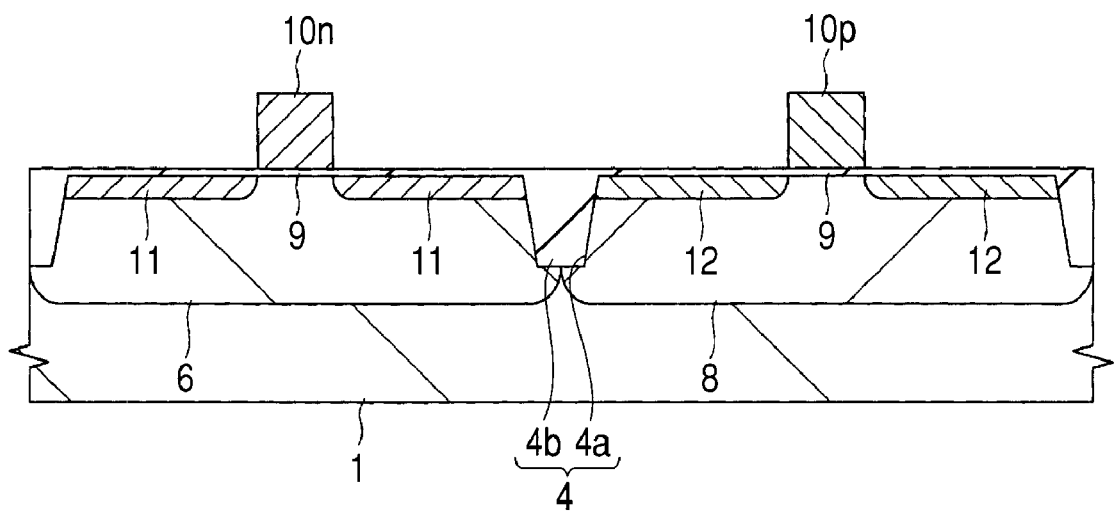
FIG. 7 is a fragmentary cross-sectional view of the same portion as that of the CMOS device illustrated in FIG. 1 in a manufacturing step following that of FIG. 6.

As illustrated in FIG. 7, after the pMIS formation region is covered with a resist pattern, an n type impurity such as phosphorus or arsenic is ion-implanted into the nMIS formation region of the semiconductor substrate 1 with the gate electrode 10n of the nMIS as a mask to form relatively lightly doped source and drain extension regions 11 of the nMIS. Similarly, after the nMIS formation region is covered with a resist pattern, a p type impurity such as $BF_2$ (boron fluoride) is ion-implanted into the pMIS formation region of the semiconductor substrate 1 with the gate electrode 10p of the pMIS as a mask to form relatively lightly doped source and drain extension regions 12 of the pMIS. These source and drain extension regions 11 and 12 have a depth of, for example, about 30 nm.

Figure 8:
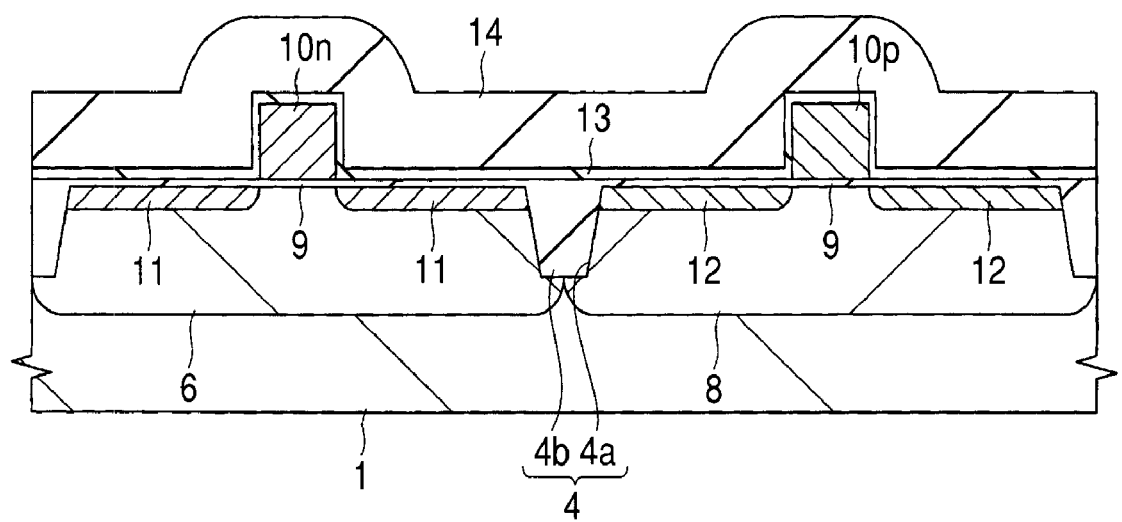
FIG. 8 is a fragmentary cross-sectional view of the same portion as that of the CMOS device illustrated in FIG. 1 in a manufacturing step following that of FIG. 7.

As illustrated in FIG. 8, after deposition of a silicon oxide film 13 of about 10 nm thick over the main surface of the semiconductor substrate 1 by CVD, a silicon nitride film 14 is deposited over the silicon oxide film 13 by CVD.

Figure 9:
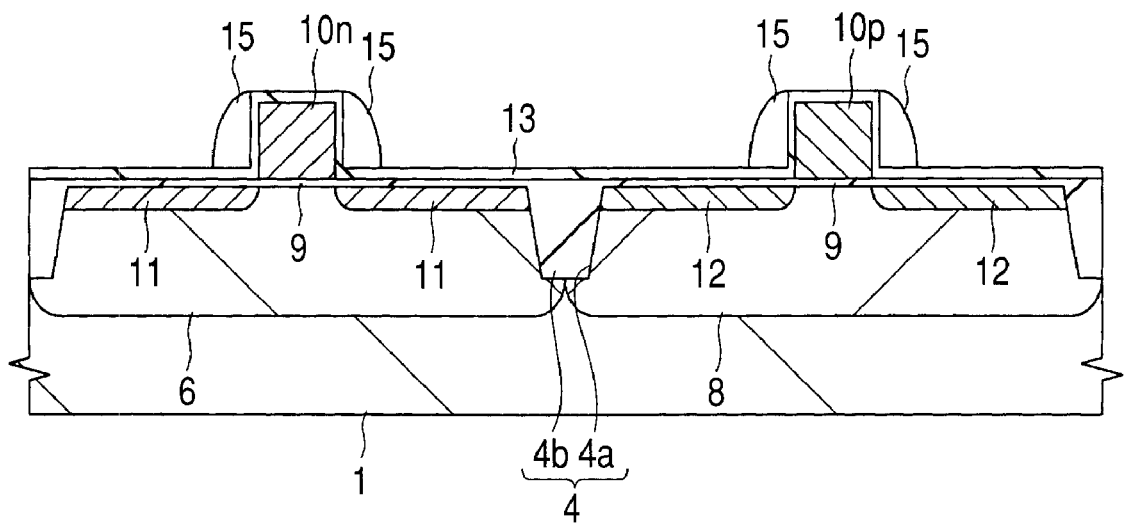
FIG. 9 is a fragmentary cross-sectional view of the same portion as that of the CMOS device illustrated in FIG. 1 in a manufacturing step following that of FIG. 8.

As illustrated in FIG. 9, the silicon nitride film 14 is anisotropically etched by RIE (Reactive Ion Etching) to form sidewalls 15 over the side surfaces of the gate electrode 10n of nMIS and gate electrode 10p of the pMIS.

Figure 10:
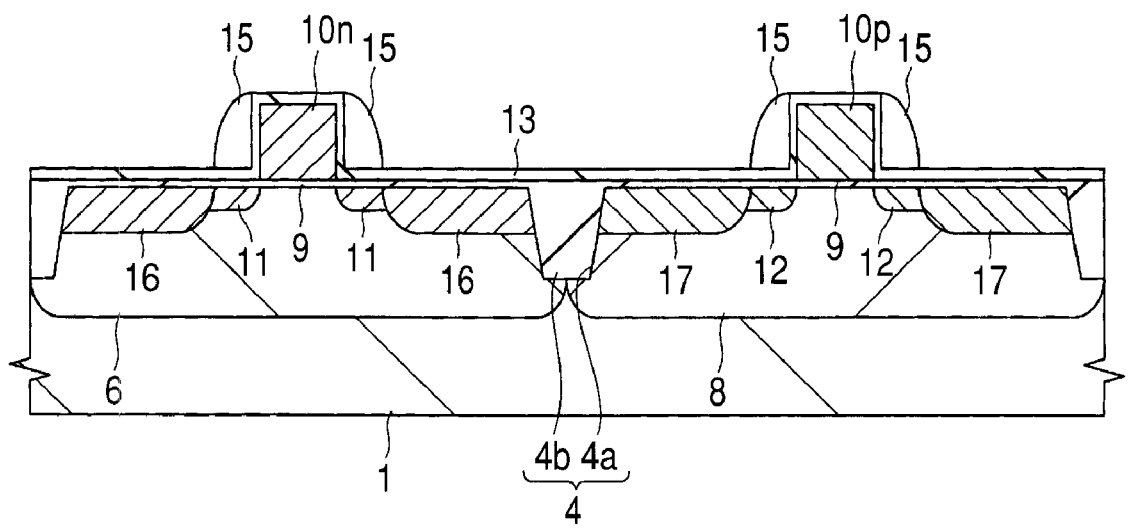
FIG. 10 is a fragmentary cross-sectional view of the same portion as that of the CMOS device illustrated in FIG. 1 in a manufacturing step following that of FIG. 9.

As illustrated in FIG. 10, after the pMIS formation region is covered with a resist pattern, an n type impurity such as arsenic is ion-implanted into the p well 6 with the gate electrode 10n and sidewalls 15 of the nMIS as a mask to form relatively heavily doped source and drain extension regions 16 of the nMIS. Similarly, after the nMIS formation region is covered with a resist pattern, a p type impurity such as boron fluoride is ion-implanted into the n well 8 with the gate electrode 10p and sidewalls 15 of the pMIS as a mask to form relatively heavily doped source and drain extension regions 17 of the pMIS.

A low resistance nickel silicide layer is then formed over the gate electrode 10n and the surface of the source and drain extension regions 16 of the nMIS and the gate electrode 10p and the surface of the source and drain extension regions 17 of the pMIS by the salicide technology. The source and drain extension regions 11 have a depth of about 50 nm.

Figure 11A:
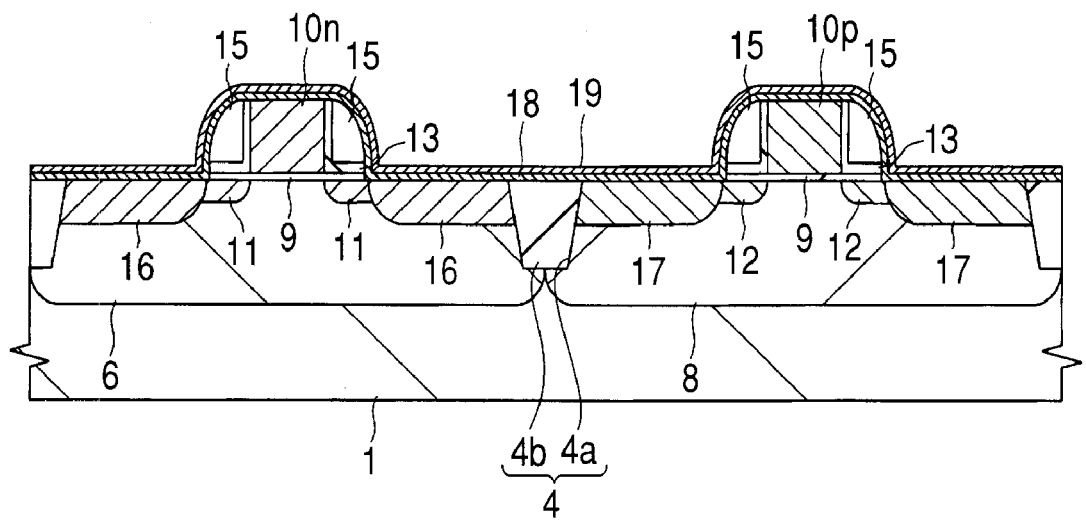
FIG. 11(a) is a fragmentary cross-sectional view of the same portion as that of the CMOS device illustrated in FIG. 1 in a manufacturing step following that of FIG. 10

As illustrated in FIG. 11(a), a nickel film 18 and a titanium nitride film 19 are deposited successively over the main surface of the semiconductor substrate 1 by sputtering. The nickel film 18 has a thickness of about 10 nm, while the titanium nitride film 19 has a thickness of about 15 nm. The titanium nitride film 19 is laid over the nickel film 18 in order to prevent the oxidation of the nickel film 18. A titanium film may be used instead of the titanium nitride film 19. For the formation of the nickel film 18 and titanium nitride film 19, a film forming apparatus 20 of a silicide material as illustrated in FIG. 12 is used. The formation process of the nickel film 18 and titanium nitride film 19 will next be described specifically.

The film forming apparatus 20 has two transfer chambers, that is, a first transfer chamber 21a and a second transfer chamber 21b. The first transfer chamber 21a has, around thereof, a loader 23, an unloader 24 and three chambers 25, 26 and 27 via a gate valve 22 which is switching means; and the second transfer chamber 21b has, around thereof, two chambers 28 and 29 via a gate valve 22. Thus, the film forming apparatus is a multi-chamber type. The first transfer chamber 21a and the second transfer chamber 21b have therebetween two chambers 30 and 31 for transfer. The first transfer chamber 21a is maintained at a predetermined vacuum degree by an exhaust mechanism or the like and has, at the center portion of the chamber, a transfer robot 32a having a multijoint arm structure for transferring a semiconductor wafer SW. Similarly, the second transfer chamber 21b is maintained at a predetermined vacuum degree by an exhaust mechanism or the like and has, at the center portion of the chamber, a transfer robot 32b having a multijoint arm structure for transferring the semiconductor wafer SW.

The chambers 25 and 26 with which the first transfer chamber 21a is equipped are heating chambers in which a relatively high-temperature heating treatment is performed, while the chamber 27 is a chamber for dry cleaning treatment. The chamber 28 with which the second transfer chamber 21b is equipped is a nickel film formation chamber in which a nickel film is formed by sputtering, while the chamber 29 is a titanium nitride film formation chamber in which a titanium nitride film is formed by sputtering. The chambers 30 and 31 which exist between the first transfer chamber 21a and second transfer chamber 21b are delivery chambers in which the delivery of the semiconductor wafer SW is performed between the first transfer chamber 21a and second transfer chamber 21b. They also serve as a cooling chamber used for cooling of the semiconductor wafer SW. The film forming apparatus 20 has three chambers with which only the first transfer chamber 21a is equipped and two chambers with which only the second transfer chamber 21b is equipped, but the film forming apparatus is not limited thereto. It is possible to add a chamber having the same using purpose or a chamber having another purpose.

First, after a FOUP (Front Open Unified Pod) having plural semiconductor wafers SW stored therein is placed on the loader 23 (Step P1 of FIG. 13), a single semiconductor wafer SW is taken out from the FOUP by using the transfer robot 32 and transferred to the first transfer chamber 21a. The FOUP is a hermetically sealing container of the semiconductor wafers SW for batch transfer and usually stores therein 25, 12 or 6 semiconductor wafers per batch. The outside wall of the container of the FOUP has an air tight structure except for a minute ventilation filter portion and dusts are excluded from the FOUP substantially completely. Accordingly, even when they are transferred in an atmosphere of cleanliness class 1000, the inside of the container can be kept at cleanliness class 1. Docking with the film forming apparatus 20 is conducted while keeping the cleanliness by drawing the door of the FOUP to the inward side of the film forming apparatus 20.

The semiconductor wafer 1 is then vacuum-transferred from the first transfer chamber 21a to the dry cleaning chamber 27 by using the transfer robot 32a (Step P2 of FIG. 13). A schematic cross-sectional view of the chamber 27 is shown in FIG. 14. The chamber 27 is composed mainly of a wafer stage 27a, wafer lift pin 27b, shower head 27c and remove plasma generator 27d. The wafer stage 27a and wafer lift pin 27b each has an independent lifting and lowering mechanism and can control the distance between the shower head 27c and semiconductor wafer SW and the distance between the semiconductor wafer SW and the wafer stage 27a freely. The shower head 27c disposed above the wafer stage 27a is constantly maintained at a predetermined temperature and its temperature is, for example, 180° C.

When the semiconductor wafer SW is carried in the chamber 27, the wafer stage 27a is lowered and the wafer lift pin 27b is raised to place the semiconductor wafer SW on the wafer lift pin 27b. The distance between the shower head 27c and semiconductor wafer SW is set, for example, 16.5±12.7 mm, while the distance between the semiconductor wafer SW and wafer stage 27a is set at, for example, 25.4±17.8 mm.

When the dry cleaning is given onto the main surface of the semiconductor wafer SW, the wafer stage 27a is raised and the wafer lift pin 27b is lowered to place the semiconductor wafer SW on the wafer stage 27a. The distance between the shower head 27c and the semiconductor wafer SW is set at, for example, 17.8±5.1 mm.

During dry cleaning, a reducing gas such as an Ar gas added with NF$_3$ gas and NH$_3$ gas is excited to generate plasma in the remote plasma generator 27d and the resulting plasma is introduced into the chamber 27. By supplying the plasma, which has been introduced into the chamber 27, over the main surface of the semiconductor wafer SW via the shower head 27c, a reduction reaction, for example, represented by the below-described equation (1) occurs between the plasma and a natural oxide film formed on the surface of silicon (the n type polycrystalline silicon film 10ns constituting the gate electrode 10n of the nMIS, single crystal silicon constituting the semiconductor substrate 1 in which source and drain extension regions 16 have been formed, the p type polycrystalline silicon film 10ps constituting the gate electrode 10p of the pMIS and single crystal silicon constituting the semiconductor substrate 1 in which the source and drain extension regions 17 have been formed), whereby the natural oxide film is removed. The processing conditions during dry cleaning are as follows: shower head temperature of 180° C., NF$_3$ gas flow rate of 14 sccm, NH$_3$ gas flow rate of 70 sccm, pressure of 400 Pa and plasma power of 30 W.

$$SiO_2 + NF_3 + NH_3 \rightarrow (NH_4)_2SiF_6 + O_2 \qquad (1)$$

The product ((NH$_4$)$_2$SiF$_6$) formed by the above-described reduction reaction remains over the main surface of the semiconductor wafer SW. Since the semiconductor wafer SW is only placed on the wafer stage 27a, the product also remains on portions of the side surface and back surface of the semiconductor wafer SW. The product remaining on portions of the side surface and back surface of the semiconductor wafer SW peels during the transfer of the semiconductor wafer SW to another chamber or the like and becomes a cause of contamination or dust. The dry cleaning is therefore followed by heat treatment of the semiconductor wafer SW in the chamber 27, whereby the product remaining over the main surface of the semiconductor wafer SW and the product remaining on portions of the side and back surfaces of the semiconductor wafer SW are removed simultaneously.

When the semiconductor wafer SW is heat treated after the dry cleaning treatment, the semiconductor wafer SW is brought close to the shower head 27c having a temperature set at 180° C. by lowering the wafer stage 27a and raising the wafer lift pin 27b. The distance between the shower head 27c and semiconductor wafer SW is set, for example, at 3.8±2.6 mm and the distance between the semiconductor wafer SW and wafer stage 27a is set at, for example, at 5.9 mm or greater.

During the heat treatment, the semiconductor wafer SW is heated by utilizing the heating temperature (180° C.) of the shower head 27c. The temperature of the semiconductor wafer SW then increases to from 100 to 150° C., whereby the product ((NH$_4$)$_2$SiF$_6$) formed over the main surface of the semiconductor wafer SW at the time of the above-described dry cleaning treatment is sublimed and removed in accordance with the reaction represented, for example, by the below-described formula (2). By this heat treatment, the product which has remained in portions of the side and back surfaces is also removed by heating the side and back surfaces of the semiconductor wafer SW.

$$(NH_4)_2SiF_6 \rightarrow SiF_4 + 2NH_3 + 2HF \qquad (2)$$

If the composition of the product formed over the semiconductor wafer SW during the above-described dry cleaning treatment is slightly different from (NH$_4$)$_2$SiF$_6$, the reaction of the formula (2) hardly occurs by the heat treatment at temperature of from 100 to 150° C. and the product cannot be removed completely. A trace amount of the product therefore remains over the main surface of the semiconductor wafer SW. As described above, remaining of a trace amount of the product over the main surface of the semiconductor wafer SW causes variations in the electrical resistance of a nickel silicide layer to be formed later over the main surface of the semiconductor wafer SW. In the next step, therefore, heat treatment at a temperature greater than 150° C. is given to the semiconductor wafer SW to remove the trace amount of the product remaining over the main surface of the semiconductor wafer SW.

By the transfer robot 32a, the semiconductor wafer SW is then vacuum-transferred from the dry cleaning chamber 27 to the heat treatment chamber 25 (or chamber 26) via the first transfer chamber 21a and placed on a stage of the chamber 25 (or chamber 26) (Step P3 of FIG. 13). By placing the semiconductor wafer SW on the stage of the chamber 25 (or chamber 26), the semiconductor wafer SW is heated at a predetermined temperature and the product which has remained over the main surface of the semiconductor wafer SW without being sublimed at a temperature of from 100 to 150° C. is removed by sublimation. As the temperature over the main surface of the semiconductor wafer SW, a range of from 150 to 400° C. may be adequate (it is needless to say that the temperature is not limited to this range under the other conditions). A temperature range suited for mass production may be from 165 to 350° C., but a range of from 180 to 220° C. with 200° C. as a center value is most suited.

By the transfer robot 32a, the semiconductor wafer SW is then vacuum-transferred from the heat treatment chamber 25 (or chamber 26) to the cooling and delivering chamber 30 (or chamber 31) via the first transfer chamber 21a and placed on a stage of the chamber 30 (or chamber 31) (Step P4 of FIG. 13). The semiconductor wafer SW placed on the stage of the chamber 30 (or chamber 31) is cooled.

By the transfer robot 32a, the semiconductor wafer SW is then vacuum-transferred from the cooling and delivering chamber 30 (or chamber 31) to the nickel film formation chamber 28 via the second transfer chamber 21b (Step P5 of FIG. 13). After the vacuum degree in the chamber 28 is adjusted to a predetermined level, for example, about 1.33× 10$^{-6}$ Pa by an exhaust mechanism, the semiconductor wafer SW is heated to a predetermined temperature. A nickel film is deposited over the main surface of the semiconductor wafer SW by sputtering, while introducing an Ar gas into the chamber 28 at a given flow rate. The nickel film has a thickness of, for example 10 nm, and sputtering upon film formation is performed, for example, under the following conditions: film forming temperature of 40° C. and Ar gas flow rate of 13 sccm.

By the transfer robot 32b, the semiconductor wafer SW is the vacuum-transferred from the nickel film formation chamber 28 to the titanium nitride film formation chamber 29 via the second transfer chamber 21b (Step P6 of FIG. 13). After adjustment of the vacuum degree in the chamber 29 to a predetermined level by an exhaust mechanism, the semiconductor wafer SW is heated to a predetermined temperature. A titanium nitride film is then deposited over the main surface of the semiconductor wafer SW by sputtering, while introducing an Ar gas and N₂ gas into the chamber 29 at a given flow rate. The titanium nitride film has a thickness of, for example, 15 nm and sputtering upon film formation is performed, for example, under the following conditions: film forming temperature of 40° C., Ar gas flow rate of 28 sccm, and a nitrogen gas flow rate of 80 sccm.

By the transfer robot 32b, the semiconductor wafer SW is then vacuum-transferred from the titanium nitride film formation chamber 29 to the cooling and delivering chamber 30 (or chamber 31) via the second transfer chamber 21b (Step P7 of FIG. 13).

By the transfer robot 32b, the semiconductor wafer SW is then vacuum transferred from the cooling and delivering chamber 30 (or chamber 31) to the unloader 24 (Step P8 of FIG. 13) and placed on the FOUP located on the unloader 24 (Step P8 of FIG. 13).

Figure 11B:
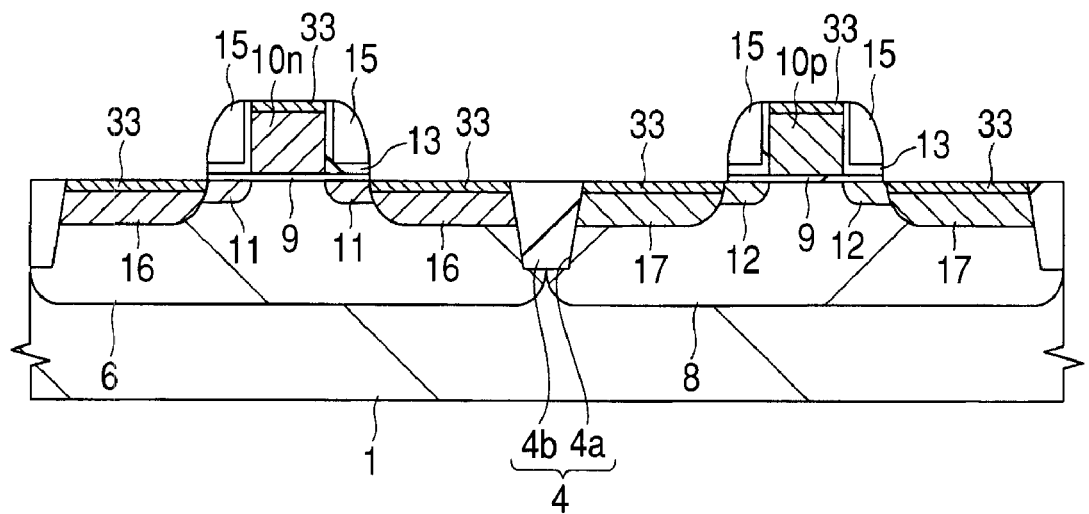
FIG. 11(b) is a fragmentary cross-sectional view of the same portion as that of the CMOS device illustrated in FIG. 1 in a manufacturing step following that of FIG. 11(a)

The semiconductor substrate 1 is then heat treated to from a nickel silicide (NiSi) layer 33 of about 20 nm thick over the surfaces of the gate electrode 10n and source and drain extension regions 16 of nMIS and the surfaces of the gate electrode 10p and source and drain extension regions 17 of the pMIS as illustrated in FIG. 11(b). The heat treatment method for the formation of the nickel silicide layer will next be described.

The semiconductor substrate 1 over which the nickel film 18 and titanium nitride film 19 have been stacked one after another is then heat treated for about 30 seconds at about 320° C. by RTA (Rapid Thermal Anneal) to selectively react the nickel film 18 with the n type polycrystalline silicon film 10ns constituting the gate electrode 10n of the nMIS and the nickel film 18 with the single crystal silicon constituting the semiconductor substrate 1 in which the source and drain extension regions 16 of the nMIS have been formed, whereby a nickel silicide layer 33 is formed. Similarly, another nickel silicide layer 33 is formed by reacting the nickel film 18 with the p type polycrystalline silicon film 10ps constituting the gate electrode 10p of the pMIS and the nickel film 18 with the single crystal silicon constituting the semiconductor substrate 1 in which the source and drain extension regions 17 of the pMIS have been formed.

After unreacted portions of the nickel film 18 and titanium nitride film 19 are removed by wet cleaning with sulfuric acid or wet cleaning with sulfuric acid and aqueous hydrogen peroxide, the semiconductor substrate 1 is heat treated for about 30 seconds at about 550° C. by RTA process to reduce the resistance of the nickel silicide layer 33.

In Embodiment 1, as described above, between the dry cleaning step (Step P2 of FIG. 13) and the step of depositing the nickel film 18 over the main surface of the semiconductor substrate 1 (Step P4 of FIG. 13) during the formation of the nickel silicide layer 33, the semiconductor substrate 1 is heat treated at from 150 to 400° C. in order to remove a product formed during the dry cleaning treatment (Step P3 of FIG. 13). By this heat treatment, self alignment reaction of the nickel film 18 to be deposited over the main surface of the semiconductor substrate 1 occurs uniformly over the surfaces of the gate electrode 10n and the source and drain extension regions 16 of the nMIS and the surfaces of the gate electrode 10p and source and drain extension regions 17 of the pMIS without being disturbed by the product, making it possible to obtain the nickel silicide layer 33 having less variations in the electrical resistance.

The distribution of sheet resistance of the gate electrode of the nMIS and pMIS over which the silicide layer of about 20 nm thick has been formed is shown in FIG. 16. More specifically, the distribution of sheet resistance of the gate electrode subjected to only heat treatment of 130° C. after dry cleaning and having a nickel silicide layer; and the distribution of sheet resistance of the gate electrode subjected to heat treatment at 130° C. and 200° C. and having a nickel silicide layer are shown in FIG. 16. As is apparent from FIG. 16, variations in the sheet resistance of the gate electrode a nickel silicide layer formed in self alignment can be reduced by adding the heat treatment at 200° C. to that at 130° C.

After formation of the low resistance nickel silicide layer 33 over the surfaces of the gate electrode 10n and source and drain extension regions 16 of the nMIS and the surfaces of the gate electrode 10p and source and drain extension regions 17 of the pMIS, interconnects for electrically coupling the CMOS device and various semiconductor elements formed over the semiconductor substrate 1 are formed.

Figure 17:
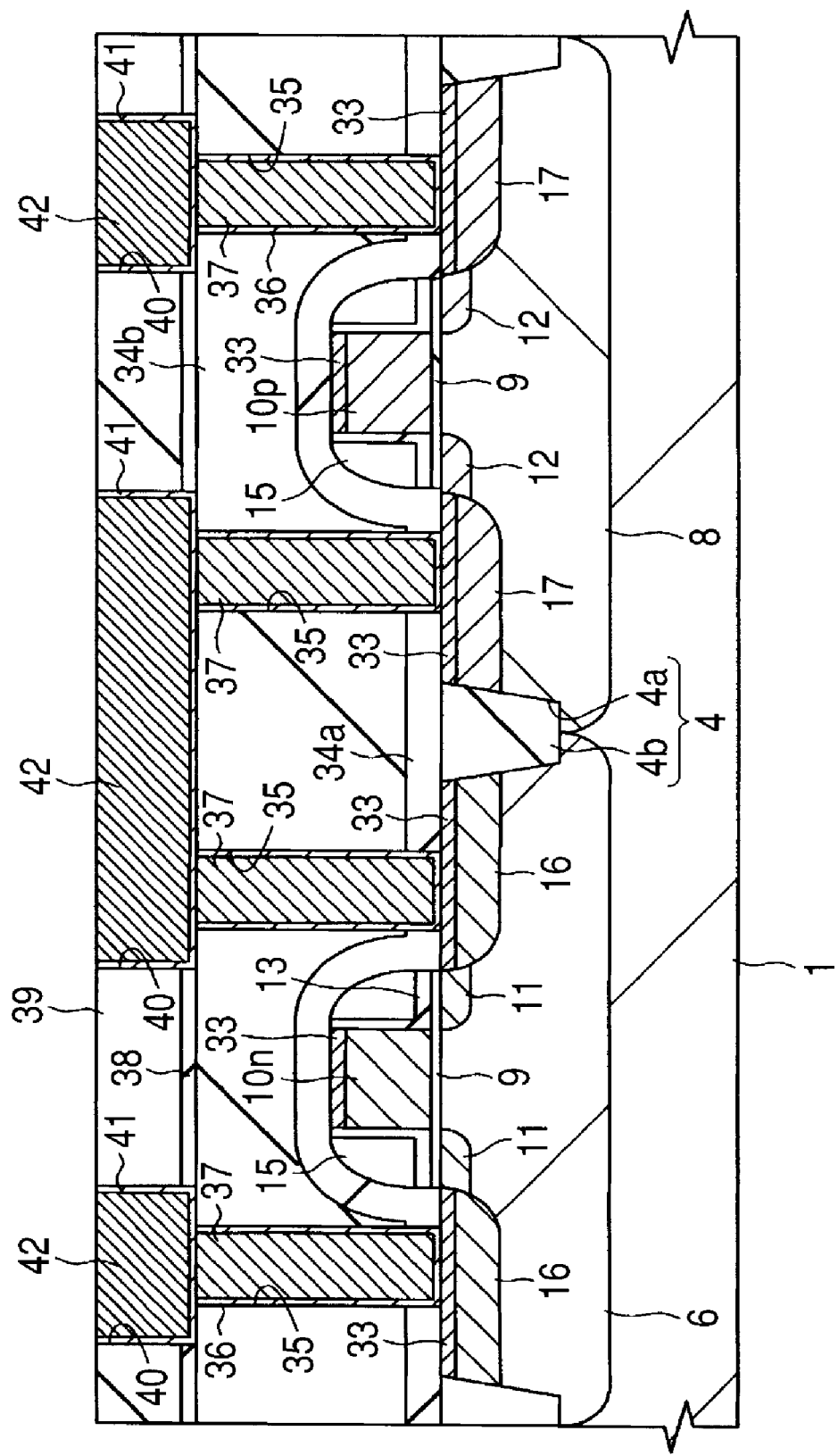
FIG. 17 is a fragmentary cross-sectional view of the same portion as that of the CMOS device illustrated in FIG. 1 in a manufacturing step following that of FIG. 11.

As illustrated in FIG. 17, a silicon nitride film is deposited over the main surface of the semiconductor substrate 1 by CVD to form a first insulating film 34a. A TEOS (Tetra Ethyl Ortho Silicate) film is then deposited over the first insulating film 34a by plasma CVD to form a second insulating film 34b, whereby an interlayer insulating film composed of first and second insulating films 34a and 34b is formed. The surface of the second insulating film 34b is then polished by CMP. Even if the first insulating film 34a has irregularities on its surface due to the step difference of the underlying film, polishing of the surface of the second insulating film 34b by CMP makes it possible to obtain an interlayer insulating film having a planarized surface.

With a resist pattern as a mask, the first and second insulating films 34a and 34b are etched to form a connecting hole 35 reaching the nickel silicide layer 33 of each of the nMIS and pMIS at predetermined positions. A barrier metal film 36 is then formed over the main surface of the semiconductor substrate 1. This barrier metal film 36 is, for example, a titanium film, titanium nitride film, or the like. A metal film, for example, a tungsten film is then deposited over the barrier metal film 36 and the surface of the metal film is planarized, for example, by CMP to bury the metal film inside of the connecting hole 35, whereby a plug 37 is formed.

A stopper insulating film 38 and an interconnect forming insulating film 39 are then formed successively over the main surface of the semiconductor substrate 1. The stopper insulating film 38 is a film serving as an etching stopper when a trench is formed in the insulating film 39 and a material adequately different in an etching rate from the insulating film 39 is employed. A silicon nitride film formed, for example, by plasma CVD can be employed as the stopper insulating film 38, while a silicon oxide film formed, for example, by plasma CVD can be used as the insulating film 39. In the stopper insulating film 38 and insulating film 39, a first-level interconnect which will be described next is formed.

By the single damascene process, the first-level interconnect is formed. First, by dry etching with a resist pattern as a mask, an interconnect trench 40 is formed in a predetermined region of the stopper insulating film 38 and insulating film 39, followed by the formation of a barrier metal film 41 over the main surface of the semiconductor substrate 1. The barrier metal film 41 is, for example, a titanium nitride film, tantalum film, tantalum nitride film, or the like. A copper seed layer is formed over the barrier metal film 41 by CVD or sputtering and then, a copper plated film is formed over the seed layer by electrolytic plating. The copper plated film is buried inside of the interconnect trench 40. The copper plated film, seed layer and barrier metal film 41 are removed by CMP from a region other than the interconnect trench 40, whereby the first-level interconnect 42 having copper as a main conductive material is formed.

Figure 18:
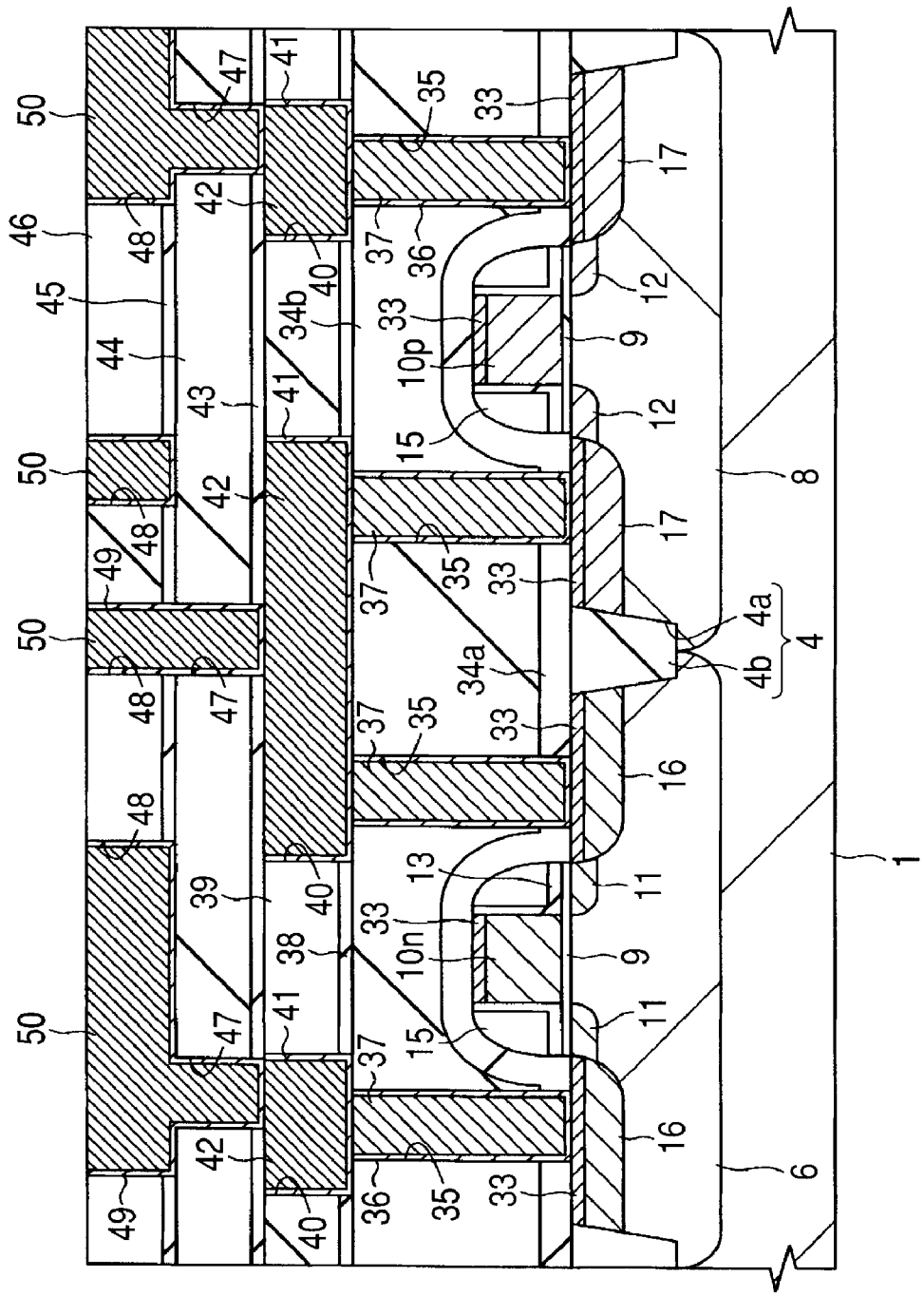
FIG. 18 is a fragmentary cross-sectional view of the same portion as that of the CMOS device illustrated in FIG. 1 in a manufacturing step following that of FIG. 17.

A second-level interconnect is then formed by the dual damascene process. Described specifically, a cap insulating film 43, an interlayer insulating film 44 and an interconnect forming stopper insulating film 45 are formed successively over the main surface of the semiconductor substrate 1 as illustrated in FIG. 18. Connecting holes are formed in the cap insulating film 43 and interlayer insulating film 44 as will be described later. The cap insulating film 43 is made of a material adequately different in etching rate from the interlayer insulating film 44 and a silicon nitride film formed, for example, by plasma CVD can be used as this film. The cap insulating film 43 has also a function as a protective film for preventing diffusion of copper which constitutes the first-level interconnect 42. As the interlayer insulating film 44, a TEOS film formed by plasma CVD, for example, can be employed. The stopper insulating film 45 is made of an insulating material adequately different in etching rate from the interlayer insulating film 44 and the interconnect forming insulating film to be deposited later as an upper layer of the stopper insulating film 45. A silicon nitride film formed by plasma CVD can be employed.

By dry etching with a hole forming resist pattern as a mask, the stopper insulating film 45 is etched to form an interconnect forming insulating film 46 over the stopper insulating film 45. For example, a TEOS film can be used as the insulating film 46.

By dry etching with an interconnect trench forming resist pattern as a mask, the insulating film 46 is etched. During this etching, the stopper insulating film 45 serves as an etching stopper. By dry etching with the stopper insulating film 45 and interconnect trench forming resist pattern as masks, the interlayer insulating film 44 is etched. During this etching, the cap insulating film 43 serves as an etching stopper. The cap insulating film 43 thus exposed is removed by dry etching, whereby a connecting hole 47 is formed in the cap insulating film 43 and interlayer insulating film 44 and an interconnect trench 48 is formed in the stopper insulating film 45 and insulating film 46.

The second-level interconnect is then formed inside of the connecting hole 47 and interconnect trench 48. The second-level interconnect is made of a barrier metal layer and a copper film which is a main conductive layer and a connecting member for connecting this interconnect to the first-level interconnect 42 which is a lower-level interconnect is formed integrally with the second-level interconnect. First, a barrier metal film 49 is formed over the main surface of the semiconductor substrate 1 including the interior surfaces of the connecting hole 47 and interconnect trench 48. The barrier metal film 49 is, for example, a titanium nitride film, a tantalum film, or a tantalum nitride film. A copper seed layer is then formed over the barrier metal film 49 by CVD or sputtering, followed by the formation of a copper plated film over the seed layer by electrolytic plating. The copper plated film is buried in the connecting hole 47 and interconnect trench 48. The copper plated film, seed layer and barrier metal film 49 are then removed by CMP from a region other than the connecting hole 47 and interconnect trench 40, whereby the second-level interconnect 50 is formed.

Figure 19:
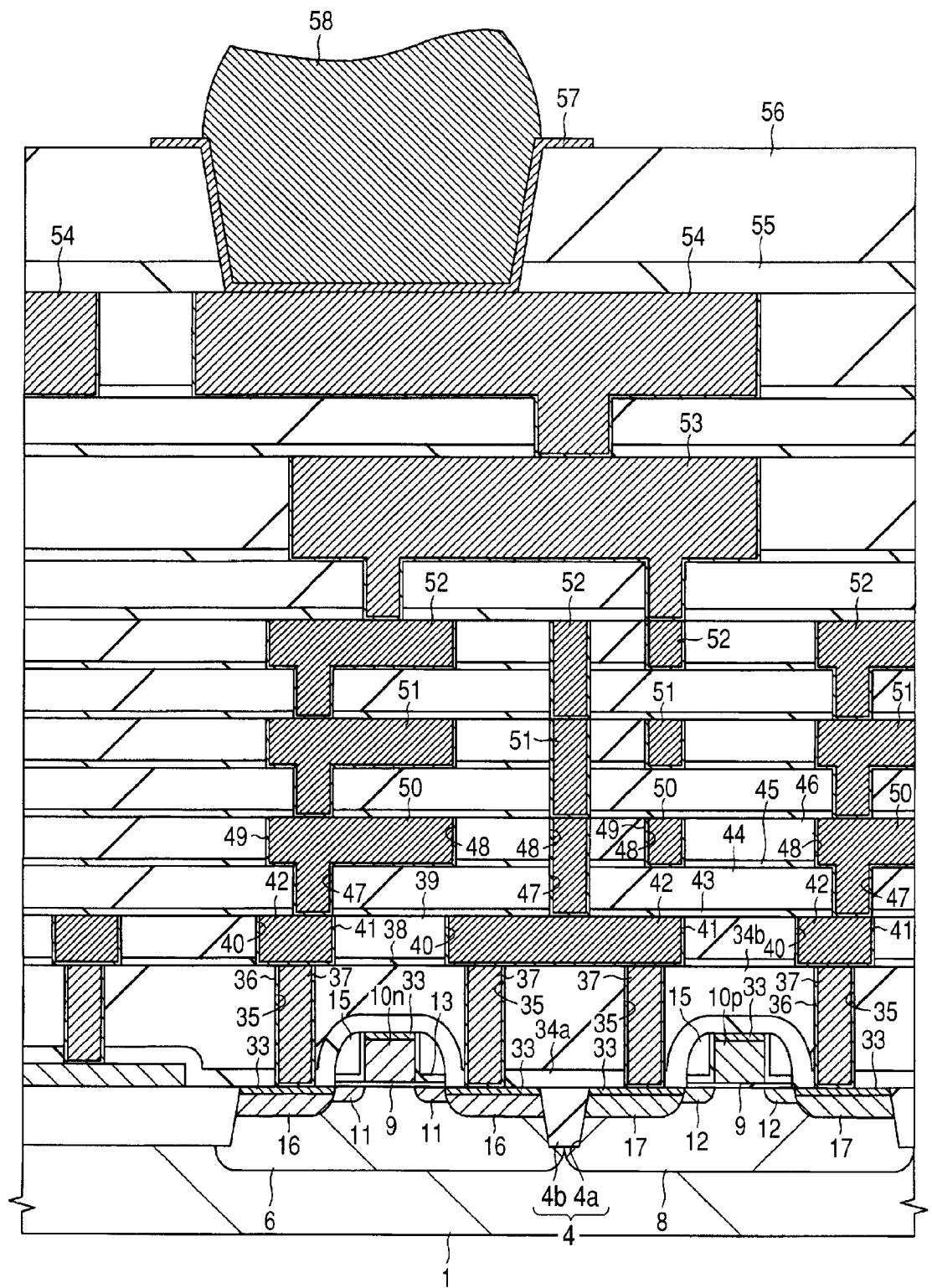
FIG. 19 is a fragmentary cross-sectional view of the same portion as that of the CMOS device illustrated in FIG. 1 in a manufacturing step following that of FIG. 18.

By a similar method to that employed for the formation of the second-level interconnect 50, upper-level interconnects are then formed as shown in FIG. 19. FIG. 19 shows a CMOS device in which third-level to six-level interconnects 51, 52, 53, and 54 have been formed. Next, a silicon nitride film 55 is formed over the sixth-level interconnect 54, followed by the formation of a silicon oxide film 56 over the silicon nitride film 55. These silicon nitride film 55 and silicon oxide film 56 function as a passivation film for preventing the penetration of water or impurities into the device from the outside and preventing transmission of α rays.

The silicon nitride film 55 and silicon oxide film 56 are etched with a resist pattern as a mask to expose a portion (bonding pad portion) of the second-level interconnect 54. A bump lower electrode 57 made of a film stack of a gold film, nickel film and the like is formed over the exposed second-level interconnect 54 and a bump electrode 58 made of gold, solder or the like is formed over the bump lower electrode 57, whereby the CMOS device of Embodiment 1 is substantially completed. This bump electrode 58 will be an electrode for external coupling. The resulting semiconductor wafer SW is then diced into respective semiconductor chips and mounted on a package substrate or the like, whereby a semiconductor device is completed. Description on these steps is however omitted.

In the dry cleaning treatment according to Embodiment 1, a reducing gas, for example, an Ar gas added with $NF_3$ gas and $NH_3$ gas (Ar gas is popularly used as a gas for plasma excitation, but another dilute gas or mixed gas thereof is also usable) is excited in the remote plasma generator 27d and the plasma thus generated is introduced into the chamber 27, whereby a natural oxide gas is removed by reductive reaction. Alternatively, the natural oxide film may be removed by the reductive reaction caused by a reducing gas, for example, a combination of HF gas and $NH_3$ gas, or a combination of $NF_3$ gas and $NH_3$ gas introduced into the chamber 27.

The plasma generator is not limited to the remote plasma generator and an ordinarily employed plasma apparatus is usable insofar as it has no problems in its characteristics. The remote plasma generator is advantageous because it does not damage the substrate.

During the treatment with plasma, the combination of reducing gases is not limited to the above-described ones, but combination with another gas is also usable insofar as it generates respective nitrogen, hydrogen and fluorine (including composite radical thereof) radicals or reaction species and it is not harmful particularly to this process. In short, a mixed gas atmosphere composed of a gas for forming nitrogen, hydrogen and fluorine radicals (including mixed gas), a plasma excitation gas, another additive gas, and the like may be used as needed.

A reaction gas such as reducing gas is not limited to the above-described gas, but any gas is usable insofar as it reacts with an oxide film over the surface of silicon at a relatively low temperature and generates an evaporating reaction species.

According to Embodiment 1, as described above, in the step of forming the nickel silicide layer 33 over the surfaces of the gate electrode 10n and source and drain extension regions 16 of the nMIS and the surfaces of the gate electrode 10p and source and drain extension regions 17 of the pMIS, a product remaining over the main surface of the semiconductor substrate 1 as a result of the dry cleaning treatment is removed by the heat treatment at a temperature greater than 150° C. so that a self alignment reaction between silicon (the n type polycrystalline silicon film 10ns constituting the gate electrode 10n of the nMIS, single crystal silicon constituting the semiconductor substrate 1 in which the source and drain extension regions 16 have been formed, p type polycrystalline silicon film 10ps constituting the gate electrode 10p of the pMIS and single crystal silicon constituting the semiconductor substrate 1 in which the source and drain extension regions 17 have been formed) with the nickel film 18 occurs uniformly without being disturbed by the product, making it possible to obtain the nickel silicide layer 33 having less variations in electrical resistance.

Embodiment 2

As described above in Embodiment 1, the dry cleaning treatment performed in the step of forming the nickel silicide layer 33 leaves a product over the main surface of the semiconductor wafer SW, and portions of the side surface and back surface thereof. A product having a composition of $(NH_4)_2SiF_6$ is removed by heating the semiconductor wafer SW at a temperature of from 100 to 150° C. by the shower head 27c, with which the dry cleaning treatment chamber 27 is equipped, set at 180° C., followed by the removal of a product having a composition slightly different from $(NH_4)_2SiF_6$ by heating in the heat treatment chamber 25 or 26 at a temperature greater than 150° C.

In Embodiment 2 according to the present invention, the product having a composition $(NH_4)_2SiF_6$ and the product having a composition slightly different from $(NH_4)_2SiF_6$ are removed by setting the temperature of a shower head 27CH, with which the dry cleaning treatment chamber 27 is equipped with, to greater than 180° C., for example, 250° C. and heating the semiconductor wafer SW at a temperature of from 180 to 220° C. by the shower head 27CH just after the dry cleaning treatment.

Figure 20:
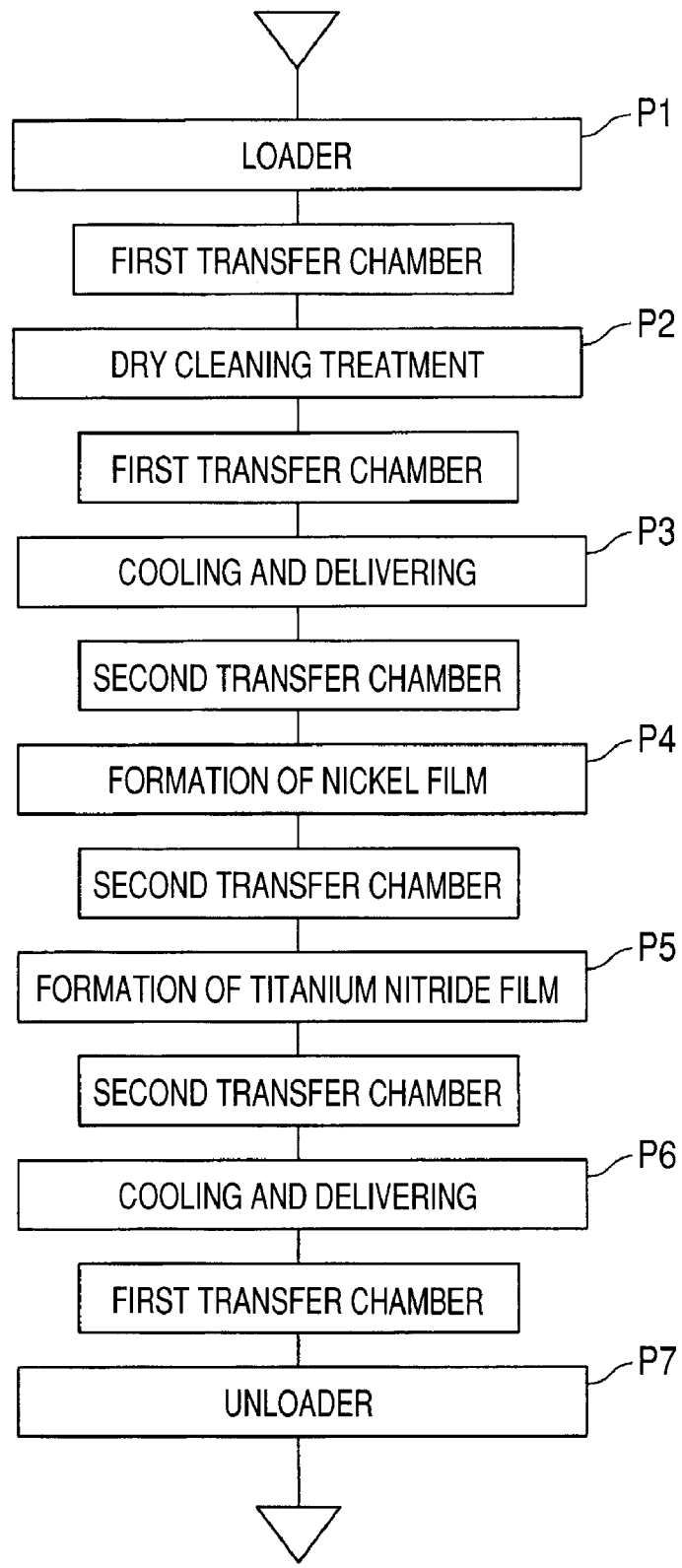
FIG. 20 is a film formation flow chart of a silicide material according to Embodiment 2 of the present invention.
Figure 21A:
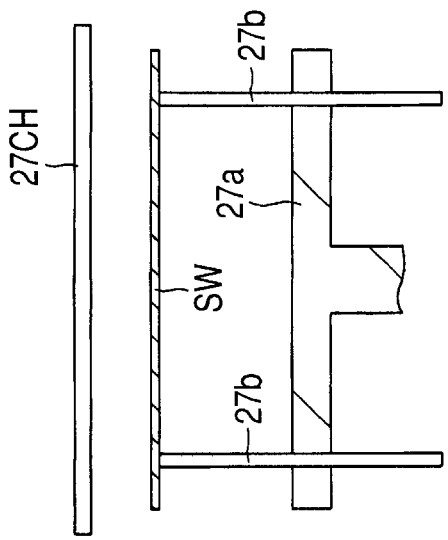
FIGS. 21(a), (b) and (c) are each a schematic cross-sectional view of a dry cleaning chamber, with which a film forming apparatus of a silicide material is equipped, according to Embodiment 2 of the present invention for explaining the treatment step of a semiconductor wafer in the chamber.

A formation process of a nickel silicide layer according to Embodiment 2 of the present invention will next be described referring to FIGS. 20 and 21. FIG. 20 is a film formation flow chart of a silicide material and FIG. 21 is a schematic cross-sectional view of a dry cleaning treatment chamber with which a film forming apparatus of the silicide material is equipped. As the film forming apparatus of the silicide material, the film forming apparatus 20 of Embodiment 1 is employed.

First, similar to Embodiment 1, the semiconductor wafer SW is vacuum-transferred from the loader 23 to the dry cleaning chamber 27 (Steps P1 and P2 of FIG. 20). The shower head 27c with which the chamber 27 is equipped is always maintained at a constant temperature and the temperature is, for example, 250° C.

When the semiconductor wafer SW is carried in the chamber 27, the semiconductor wafer SW is placed on the wafer lift pin 27b by lowering the wafer stage 27a and raising the wafer lift pin 27b. The distance between the shower head 27CH and semiconductor wafer SW is set, for example, at 16.5±12.7 mm and the distance between the semiconductor wafer SW and wafer stage 27a is set at, for example, at 25.4 mm±17.8 mm.

Figure 21B:
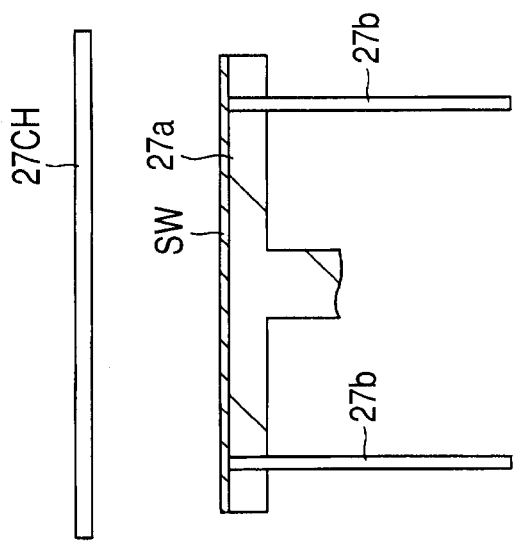
Figure 21C:
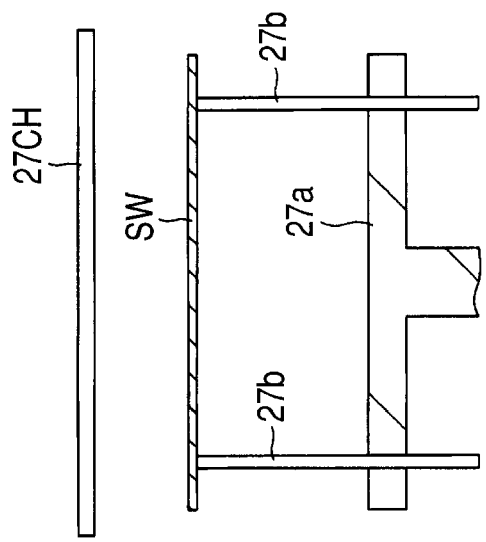

When the dry cleaning treatment is then performed over the main surface of the semiconductor wafer SW, the semiconductor wafer SW is placed on the wafer stage 27a by raising the wafer stage 27a and lowering the wafer lift pin 27b, as illustrated in FIG. 21(b). The distance between the shower head 27CH and semiconductor wafer SW is set, for example, at 17.8±5.1 mm. A product $((NH_4)_2SiF_6)$ formed by the reduction reaction remains over the main surface of the dry-cleaned semiconductor wafer SW and portions of side surface and back surface thereof.

When the semiconductor wafer SW is heat treated, the semiconductor wafer SW is brought close to the shower head 27CH having a temperature set at 250° C. by lowering the wafer stage 27a and raising the wafer lift pin 27b. The distance between the shower head 27CH and semiconductor wafer SW is set, for example, at 3.8±2.6 mm and the distance between the semiconductor wafer SW and wafer stage 27a is set at, for example, at 5.9 mm or greater.

During the heat treatment, the semiconductor wafer SW is heat treated while utilizing the heating temperature (250° C.) of the shower head 27CH so that the temperature of the semiconductor wafer SW becomes greater than 150° C. As a result, the product having a composition $(NH_4)_2SiF_6$ which has remained over the main surface of the semiconductor wafer SW and portions of the side surface and back surface thereof after the dry cleaning treatment and also the product having a composition slightly different from $(NH_4)_2SiF_6$ are removed.

By the transfer robot 32a, the semiconductor wafer SW is vacuum-transferred from the dry cleaning chamber 27 to the cooling and delivering chamber 30 (or chamber 31) via the first transfer chamber 21a and is placed over a stage with which the chamber 30 (or chamber 31) is equipped (Step P3 of FIG. 20). The semiconductor wafer SW is placed on the stage of the chamber 30 (or chamber 31) and is cooled there.

Similar to Embodiment 1, after a nickel film is deposited in the nickel film forming chamber 28 (Step P4 of FIG. 20) and a titanium nitride film is deposited over the nickel film in the titanium nitride film forming chamber 29 (Step P5 of FIG. 20), the semiconductor wafer SW is vacuum transferred by the transfer robot 32a to the cooling and delivering chamber 30 (or chamber 31) (Step P6 of FIG. 20). The semiconductor wafer SW is then vacuum-transferred to the unloader 24 by the transfer robot 32a and is placed on the FOUP on the unloader 24 (Step P7 of FIG. 20).

According to Embodiment 2, the product formed over portions of the side surface and back surface of the semiconductor wafer SW as a result of the dry cleaning treatment is removed by the heat treatment, subsequent to the dry cleaning treatment, at from 180 to 220° C. by the shower head 27C so that the heat treatment step in the heat treatment chamber 25 or 26 in Embodiment 1 becomes unnecessary, leading to a reduction in the number of manufacturing steps compared with that of Embodiment 1.

Embodiment 3

As described above in Embodiment 1, in the dry cleaning treatment performed in the formation step of the nickel silicide layer 33, the semiconductor wafer SW is usually only placed on the wafer stage 27a so that the product having a composition $(NH_4)_2SiF_6$ remains not only over the main surface of the semiconductor wafer SW but also over portions of the side surface and back surface of the semiconductor wafer SW. The product remaining over portions of the side surface and back surface of the semiconductor wafer SW may peel during the transfer of the semiconductor wafer SW to another chamber and cause contamination or dust. In Embodiments 1 and 2, the dry cleaning treatment is therefore followed by the heat treatment of the semiconductor wafer SW in the same chamber 27 to remove the product remaining over the main surface of the semiconductor wafer SW and at the same time, the product remaining over portions of the side surface and back surface of the semiconductor wafer SW.

In Embodiment 3, the formation of the product over portions of the side surface and back surface of the semiconductor wafer SW is disturbed by preventing the penetration of the dry cleaning gas toward the back side of the semiconductor wafer SW during the dry cleaning treatment. The heat treatment of the semiconductor wafer SW by the shower head 27a subsequent to the dry cleaning treatment in Embodiment 1, that is, the heat treatment (FIG. 15(c)) by lowering the wafer stage 27a of the chamber 27 and raising the wafer lift pin 27b, thereby bringing the semiconductor wafer SW close to the shower head 27c set at 180° C. becomes unnecessary. The product remaining over the main surface of the semiconductor wafer SW as a result of the dry cleaning treatment can be removed by the heat treatment at a temperature greater than 150° C. in the heat treatment chamber 25 or 26.

The dry cleaning methods according to Embodiment 3 of the present invention will next be described referring to FIG. 22. FIGS. 22(*a*), (*b*) and (*c*) are each a schematic cross-sectional view of a dry cleaning chamber with which a film forming apparatus of a silicide material is equipped.

FIG. 22(*a*) is a diagram for explaining a first dry cleaning method for preventing the generation of the product over portions of the side surface and back surface of the semiconductor wafer SW. The semiconductor wafer SW is placed on the wafer stage 27*a* and the penetration of the dry cleaning gas into the periphery and back side of the semiconductor wafer SW is prevented by bringing a sealing 27*e* having a raising and lowering mechanism into contact with the periphery over the main surface the semiconductor wafer SW and pressing it against the semiconductor wafer SW.

FIG. 22(*b*) is a diagram for explaining a second dry cleaning method for preventing the generation of the product over portions of the side surface and back surface of the semiconductor wafer SW. The semiconductor wafer SW is placed over a wafer stage 27*a* having an electrostatic chuck function and it can be dry cleaned without forming a gap between the back side of the semiconductor wafer SW and the wafer stage 27*a*. The electrostatic chuck has a mechanism of applying a voltage between the wafer stage 27*a* and semiconductor wafer SW by using a dielectric layer disposed on the wafer stage 27*a* and adsorbing the semiconductor wafer SW by utilizing a force generated therebetween. The electrostatic chuck can be classified into two types depending on the adsorption system, that is, coulomb type and Johnsen Rahbek type each of which uses an insulating material as a dielectric substance. Many electrostatic chucks made of ceramic such as alumina employ the Johnsen Rahbek type having a strong adsorption force at a low voltage and this type is popular because of advantages in heat resistance and plasma resistance. The electrostatic chuck does not need a mechanical supporting tool so that it enables uniform treatment all over the surface of the semiconductor wafer SW.

A shadow ring 27*f* having a raising and lowering mechanism is disposed at the periphery over the main surface of the semiconductor wafer SW. An inert gas such as He gas is supplied upward from the periphery of the wafer stage 27*a* while covering the periphery of the semiconductor wafer SW with the shadow ring 27*f* without bringing it into contact with the semiconductor wafer SW. This makes it possible to prevent the penetration of the dry cleaning gas to the periphery and back surface of the semiconductor wafer SW.

FIG. 22(*c*) is a diagram for explaining a third dry cleaning method for preventing the generation of the product over portions of the side surface and back surface of the semiconductor wafer SW. The semiconductor wafer SW is placed over the wafer stage 27*a* and the penetration of the dry cleaning gas into the periphery and back surface of the semiconductor wafer SW is prevented by bringing the sealing 27*e* having a raising and lowering mechanism into contact with the periphery over the main surface of the semiconductor wafer SW.

The sealing 27*e* has, in the lower portion thereof, an exhaust chamber 27*g* connected to the sealing 27*e* and the wafer stage 27*a* is placed in the exhaust chamber 27*g*. The exhaust chamber 27*g* is equipped with a tube for introducing an inert gas such as He gas to the exhaust chamber 27*g* and another tube for exhausting it from the exhaust chamber 27*g*, whereby the inert gas can be supplied to the periphery and back surface of the semiconductor wafer SW.

As described above, according to Embodiment 3, no unnecessary product is formed over portions of the side surface and back surface of the semiconductor wafer SW by the dry cleaning treatment so that heat treatment of the semiconductor wafer SW by the shower head 27*c* following the dry cleaning treatment becomes unnecessary. The number of the manufacturing steps can therefore be made smaller than that of Embodiment 1.

The invention made by the present inventors was so far described specifically based on some embodiments. The invention is not limited to or by these embodiments. It is needless to say that they can be modified without departing from the scope of the invention.

The present invention can be used for semiconductor devices having a metal silicide, particularly, nickel silicide formed by the salicide technology.

What is claimed is:

1. A method of manufacturing a semiconductor device by forming a nickel silicide layer in self alignment, comprising, prior to the deposition of a nickel film over silicon, the steps of:
    (a) placing a semiconductor wafer over a wafer stage with which a first chamber is equipped;
    (b) dry cleaning a surface of the silicon over a main surface of the semiconductor wafer with a reducing gas supplied via a shower head located above the wafer stage;
    (c) heat treating the semiconductor wafer at a first temperature which has utilized a heating temperature of the shower head;
    (d) transferring the semiconductor wafer from the first chamber to a second chamber; and
    (e) heat treating the semiconductor wafer in the second chamber at a second temperature greater than the first temperature.

2. A method of manufacturing a semiconductor device according to claim 1, wherein the first temperature is from 100 to 150° C.

3. A method of manufacturing a semiconductor device according to claim 1, wherein the second temperature is from 150 to 400°C.

4. A method of manufacturing a semiconductor device according to claim 1, wherein the second temperature is from 165 to 350° C.

5. A method of manufacturing a semiconductor device according to claim 1, wherein the second temperature is from 180 to 220° C.

6. A method of manufacturing a semiconductor device according to claim 1, wherein the second temperature is 200° C.

7. A method of manufacturing a semiconductor device according to claim 1, wherein the semiconductor wafer is vacuum-transferred between the first chamber and the second chamber.

8. A method of manufacturing a semiconductor device according to claim 1, wherein the silicon is polycrystalline silicon constituting a gate electrode of a field effect transistor or single crystal silicon constituting the semiconductor wafer in which source and drain diffusion regions are formed.

9. A method of manufacturing a semiconductor device by forming a nickel silicide layer in self alignment, comprising, prior to the deposition of a nickel film over silicon, the steps of:
    (a) placing a semiconductor wafer over a wafer stage with which a first chamber is equipped;
    (b) dry cleaning a surface of the silicon over a main surface of the semiconductor wafer with a reducing gas supplied via a shower head located above the wafer stage; and (c) heat treating the semiconductor wafer at a first temperature which has utilized the heating temperature of the shower head,
wherein the shower head is maintained at a temperature greater than 180° C.

10. A method of manufacturing a semiconductor device according to claim 9, wherein the first temperature is from 180 to 220° C.

11. A method of manufacturing a semiconductor device according to claim 9, wherein the first temperature is 200° C.

12. A method of manufacturing a semiconductor device according to claim 9, wherein the silicon is polycrystalline silicon constituting a gate electrode of a field effect transistor or single crystal silicon constituting the semiconductor wafer in which source and drain diffusion regions are formed.

13. A method of manufacturing a semiconductor device by forming a nickel silicide layer in self alignment, comprising, prior to the deposition of a nickel film over silicon, the steps of:
(a) placing a semiconductor wafer over a wafer stage with which a first chamber is equipped;
(b) dry cleaning a surface of the silicon over a main surface of the semiconductor wafer with a reducing gas supplied via a shower head located above the wafer stage;
(c) transferring the semiconductor wafer from the first chamber to the second chamber; and
(d) heat treating the semiconductor wafer at a second temperature in the second chamber,
wherein in the step (b), no reducing gas is supplied to the side surface and back surface of the semiconductor wafer.

14. A method of manufacturing a semiconductor device according to claim 13, wherein the second temperature is from 150 to 400° C.

15. A method of manufacturing a semiconductor device according to claim 13, wherein the second temperature is from 165 to 350° C.

16. A method of manufacturing a semiconductor device according to claim 13, wherein the second temperature is from 180 to 220° C.

17. A method of manufacturing a semiconductor device according to claim 13, wherein the second temperature is 200° C.

18. A method of manufacturing a semiconductor device according to claim 13, wherein the step (b) comprises a sub-step of:
(b1) holding down, with a sealing, the peripheral portion of the semiconductor wafer placed over the wafer stage.

19. A method of manufacturing a semiconductor device according to claim 13, wherein the step (b) comprises the sub-steps of:
(b1) adsorbing the semiconductor wafer onto the wafer stage by using an electrostatic chuck; and
(b2) covering the peripheral portion of the semiconductor wafer with a shadow ring without bringing the ring into contact with the semiconductor wafer and supplying an inert gas from the peripheral portion of the wafer stage.

20. A method of manufacturing a semiconductor device according to claim 13, wherein the step (b) comprises the sub-steps of:
(b1) holding down, with a sealing, the peripheral portion of the semiconductor wafer placed over the wafer stage; and
(b2) supplying an inert gas from the back side of the wafer stage.

21. A method of manufacturing a semiconductor device according to claim 13, wherein the semiconductor wafer is vacuum-transferred from the first chamber to the second chamber.

22. A method of manufacturing a semiconductor device according to claim 13, wherein the silicon is polycrystalline silicon constituting a gate electrode of a field effect transistor or single crystal silicon constituting the semiconductor wafer in which source and drain diffusion regions are formed.

* * * * *